US009644805B2

(12) United States Patent
Nakanishi et al.

(10) Patent No.: US 9,644,805 B2
(45) Date of Patent: May 9, 2017

(54) OPTICAL ASSEMBLY AND METHOD FOR ASSEMBLING THE SAME, AND OPTICAL MODULE IMPLEMENTED WITH OPTICAL ASSEMBLY

(71) Applicant: Sumitomo Electric Industries, Ltd., Osaka-shi (JP)

(72) Inventors: Hiromi Nakanishi, Yokohama (JP); Takeshi Okada, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 115 days.

(21) Appl. No.: 14/813,879

(22) Filed: Jul. 30, 2015

(65) Prior Publication Data
US 2015/0338664 A1    Nov. 26, 2015

Related U.S. Application Data

(63) Continuation of application No. 14/192,385, filed on Feb. 27, 2014, now Pat. No. 9,243,761.

(30) Foreign Application Priority Data

Feb. 28, 2013  (JP) ................................ 2013-039974
Jul. 8, 2013   (JP) ................................ 2013-142643

(51) Int. Cl.
*H01S 5/00*     (2006.01)
*F21K 9/90*     (2016.01)
(Continued)

(52) U.S. Cl.
CPC .............. *F21K 9/90* (2013.01); *G02B 27/102* (2013.01); *G02B 27/141* (2013.01);
(Continued)

(58) Field of Classification Search
CPC ...... H01S 5/141; H01S 3/1062; H01S 3/2383; H01S 5/0071; H01S 5/02252;
(Continued)

(56) References Cited

U.S. PATENT DOCUMENTS 6,876,679 B1   4/2005  Bowler et al.
8,562,150 B2  10/2013  Hashizume
(Continued)

FOREIGN PATENT DOCUMENTS

EP   2 403 078 A2   1/2012
JP   S61-201491 A   9/1986
(Continued)

OTHER PUBLICATIONS

Decision to Dismiss an Amendment in Japanese Patent Application No. P2014-207348, dated Aug. 9, 2016.
(Continued)

*Primary Examiner* — Jessica Manno
*Assistant Examiner* — Delma R Forde
(74) *Attorney, Agent, or Firm* — Venable LLP; Michael A. Sartori; Laura G. Remus

(57) ABSTRACT

An optical assembly that installs red, green, blue laser diodes (LDs) within a single package is disclosed. The LDs are mounted on a base via respective sub-mounts. Light emitted from the LDs is collimated by collimating lenses and multiplexed by two wavelength filters so as to align optical axes of the light. The multiplexed light has an axis substantially leveled with the axes of the red, green, and blue light measured from the top of the base.

14 Claims, 28 Drawing Sheets

(51) Int. Cl.
*G02B 27/10* (2006.01)
*G02B 27/14* (2006.01)
*G02B 27/30* (2006.01)
*H01S 5/022* (2006.01)
*G03B 21/20* (2006.01)
*H01S 5/40* (2006.01)

(52) U.S. Cl.
CPC ........... *G02B 27/145* (2013.01); *G02B 27/30* (2013.01); *G03B 21/2033* (2013.01); *H01S 5/0071* (2013.01); *H01S 5/0078* (2013.01); *H01S 5/02212* (2013.01); *H01S 5/02288* (2013.01); *H01S 5/4012* (2013.01); *H01S 5/4093* (2013.01); *H01S 5/02248* (2013.01); *H01S 5/02292* (2013.01); *H01S 5/4025* (2013.01); *Y10T 29/41* (2015.01)

(58) Field of Classification Search
CPC ............. H01S 5/18308; H01S 5/18388; H01S 5/4087; H01S 5/4093; H01S 3/0941; H01S 3/2391; H01S 3/0933; H01S 3/08027; H01S 5/32341; H01S 5/4012; H01S 5/0078; H01S 5/02212; H01S 5/02288; H01S 5/02248; H01S 5/02292; H01S 5/4025; F21K 9/90; G02B 27/102; G02B 27/141; G02B 27/145; G02B 27/30; G03B 21/2033; Y10T 29/41
USPC .......... 372/50.12, 43.01, 50.1, 92, 101, 107, 372/109; 362/19, 231
See application file for complete search history.

(56) References Cited

U.S. PATENT DOCUMENTS

| | | | |
|---|---|---|---|
| 8,891,579 | B1 | 11/2014 | Price et al. |
| 9,348,157 | B2 * | 5/2016 | Kurokawa ............ G02F 1/093 |
| 2008/0068722 | A1 | 3/2008 | Chow |
| 2009/0103923 | A1 | 4/2009 | Hosomi et al. |
| 2009/0245315 | A1 | 10/2009 | Faybishenko |
| 2011/0304832 | A1 * | 12/2011 | Hashizume .......... H04N 9/3129 353/85 |
| 2012/0148192 | A1 | 6/2012 | Nakanishi |
| 2013/0011104 | A1 | 1/2013 | Sato |
| 2013/0021581 | A1 | 1/2013 | Takahashi et al. |
| 2013/0039374 | A1 | 2/2013 | Lutgen et al. |

FOREIGN PATENT DOCUMENTS

| | | |
|---|---|---|
| JP | H02-69606 A | 3/1990 |
| JP | H04-117637 A | 4/1992 |
| JP | 06-20297 A | 1/1994 |
| JP | 07-063943 A | 3/1995 |
| JP | H07-074343 | 3/1995 |
| JP | 2000-012957 A | 1/2000 |
| JP | 2002-190636 A | 7/2002 |
| JP | 2003-168838 A | 6/2003 |
| JP | 2003-198031 A | 7/2003 |
| JP | 2004-134642 A | 4/2004 |
| JP | 2004-281770 A | 10/2004 |
| JP | 2005-183005 A | 7/2005 |
| JP | 2005-234052 A | 9/2005 |
| JP | 2006-013127 A | 1/2006 |
| JP | 2006-186243 A | 7/2006 |
| JP | 2007-135123 A | 5/2007 |
| JP | 2007-165722 A | 6/2007 |
| JP | 2007-280460 A | 10/2007 |
| JP | 2008-003270 A | 1/2008 |
| JP | 2008-309935 A | 12/2008 |
| JP | 2009-169099 A | 7/2009 |
| JP | 2009-283778 A | 12/2009 |
| JP | 2010-040443 A | 2/2010 |
| JP | 2010-078749 A | 4/2010 |
| JP | 2010-191231 A | 9/2010 |
| JP | 2010-197864 A | 9/2010 |
| JP | 2011-039326 A | 2/2011 |
| JP | 2011-066028 A | 3/2011 |
| JP | 2011-171535 A | 9/2011 |
| JP | 2011-197217 A | 10/2011 |
| JP | 2011-227379 A | 11/2011 |
| JP | 2012-018208 A | 1/2012 |
| JP | 2012-141483 A | 7/2012 |
| WO | WO-2011/040290 A1 | 4/2011 |
| WO | WO-2011/048667 A1 | 4/2011 |
| WO | WO-2012/014798 A1 | 2/2012 |
| WO | WO-2013/146749 A1 | 10/2013 |
| WO | WO-2013/170988 A1 | 11/2013 |

OTHER PUBLICATIONS

Notice of Reasons for Rejection in Japanese Patent Application No. 2013-039974, dated Sep. 9, 2014.
Notice of Reasons for Rejection in Japanese Patent Application No. 2013-142643, dated Sep. 9, 2014.
International Search Report and Written Opinion in PCT International Application No. PCT/JP2014/068166, dated Sep. 16, 2014.
Notice of Release of Reexamination of Japanese Patent Application No. 2013-039974, dated Feb. 17, 2015.
Notice of Reasons for Rejection in Japanese Patent Application No. 2013-039974, dated Mar. 3, 2015.
International Search Report and Written Opinion in International Patent Application No. PCT/JP2014/072324 dated Apr. 21, 2015.
International Preliminary Report on Patentability and Written Opinion, in International Patent Application No. PCT/JP2014/068166, dated Jan. 21, 2016.
Notification of Reasons for Refusal in Japanese Patent Application No. 2014-207348, dated Nov. 17, 2015.
Notification of Reasons for Refusal in Japanese Patent Application No. 2015-008089, dated Nov. 17, 2015.

* cited by examiner

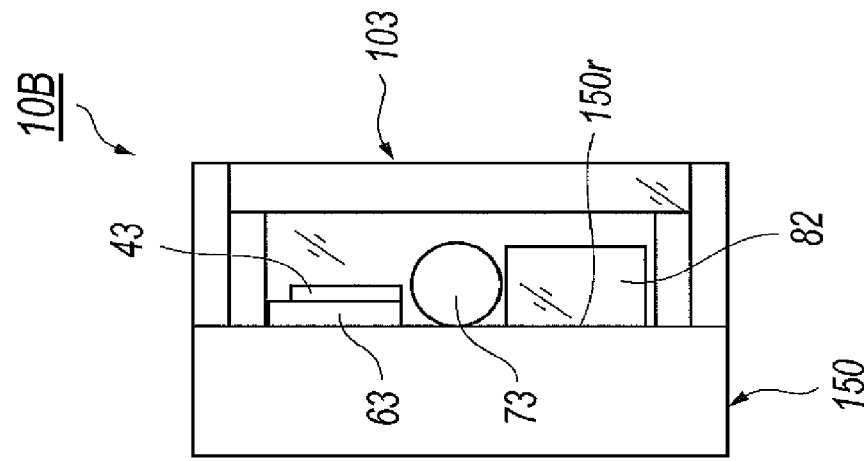
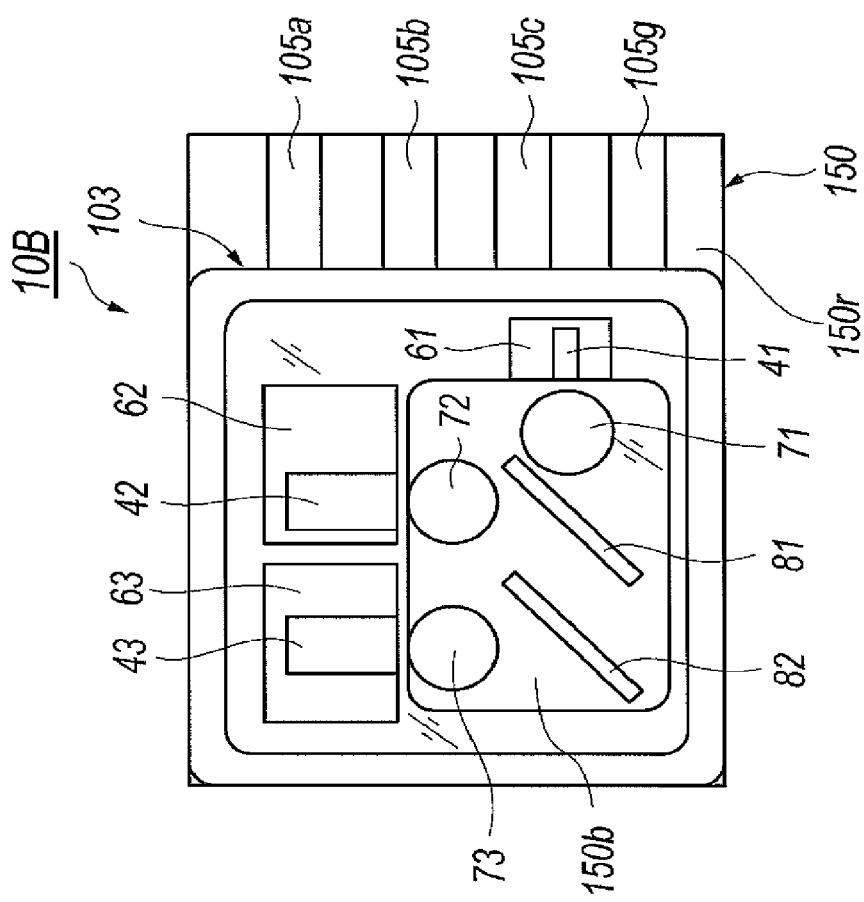

OPTICAL ASSEMBLY AND METHOD FOR ASSEMBLING THE SAME, AND OPTICAL MODULE IMPLEMENTED WITH OPTICAL ASSEMBLY

CROSS-REFERENCE TO RELATED CASES

This application is a Continuation of U.S. patent application Ser. No. 14/192,385, filed Feb. 27, 2014, which claims the benefit of Japanese Patent Application Nos. 2013-039974 and 2013-142643, filed Feb. 28, 2013 and Jul. 8, 2013, respectively.

BACKGROUND

1. Filed of the Invention

The present invention relates to an optical assembly having three optical sources each corresponding to the three primary colors, and a method to assemble the optical assembly.

2. Background Arts

Flat panel displays have been so popular in the consumer market, and a trend to apply the displays to mobile communications has advanced. One type of flat panel displays installs laser didoes, which is superior in aspects of the power consumption, the definition, and the saturation compared with those implementing with white LEDs (Light Emitting Diode) as an optical source of the backlight of the display. Accordingly, the flat panel display implementing with LDs is going to be applied to, for instance, small sized projectors, head-mount displays, head-up displays, and so on. Such an optical source implements with three LDs, namely, a red LD, a green LD, and a blue LD, corresponding to the three primary colors. High quality image with the superior saturation may be achieved by mixing laser light emitted from respective LDs as modifying amplitudes thereof.

In order to mix three colors, wavelength selective filters and other optical components to guide the mixed light to an optical apparatus, such as MEMS (Micro Electro-Mechanical System), DLP (Digital Light Processor), LCOS (Liquid Crystal On Silicon) and so on, are needed. When three LDs and other optical components are installed within an optical module, an extremely precise optical alignment of the LDs and the components is inevitable because the LDs operate as a point optical source but the far field pattern thereof is necessary to be set narrower, for instance, the far field pattern of 10°×20° is necessary. When three LDs are independently packaged and the optical system to guide light to those apparatus are prepared outside of the LD packages, the total size of the system to provide the three primary colors becomes large.

SUMMARY

One aspect of the present application relates to a method to assemble an optical assembly. The optical assembly provides red, green, and blue LDs; first to third lenses, and a base that mounts the red, green and blue LDs and the first to third lenses. The optical assembly outputs multiplexed light containing the red, green, and blue light emitted from red, green and blue LDs, respectively.

The method includes steps of: (1) mounting a first LD among the red, green and blue LDs on a top surface of the base such that the first LD emits first light projecting on a first point on a virtual plane after it is transmitted through the first lens, where the first point is positioned on a line corresponding to the top surface of the base; (2) mounting a second LD among the red, green and blue LDs except for the first LD on the top surface of the base such that the second LD emits second light projecting on a second point on the virtual plane after it is transmitted through the second lens, where the second point is positioned on the line; (3) mounting a third LD among the red, green and blue LDs except for the first and second LDs on the top surface of the base such that third LD emits third light projecting on a third point on the virtual plane after it is transmitted through the third lens, where the third point is positioned on the line; (4) after mounting the second LD, mounting a first wavelength filter (WSF) on the top surface of the base, where the first WSF transmits one of the first light transmitted through the first lens and the second light transmitted through the second lens but reflects another of the first light transmitted through the first lens and the second light transmitted through the second lens, such that one of the first light and the second light reflected by the first WSF projects on a point on the virtual plane on which another of the first light transmitted through the first lens and the second light transmitted through the second lens projects, where the first WSF outputs a mid-multiplexed light containing the first light and the second light; and (5) mounting a second WSF on the top surface of the base, where the second WSF transmits one of the mid-multiplexed light and the third light transmitted through the third lens but reflects another of the mid-multiplexed light and the third light transmitted through the third lens, such that one of the mid-multiplexed light and the third light reflected by the second WSF projects on a point on which another of the mid-multiplexed light and the third light transmitted through the second WSF projects, where the second WSF outputs the multiplexed light.

Another aspect to the present application relates to an optical module. The optical module that outputs multiplexed light containing red light, green light, and blue light includes a first laser diode (LD) to emit the red light; a second LD to emit the green light; a third LD to emit the blue light; a first lens to collimate the red light emitted from the first LD to generate collimated red light, the first lens being mounted on the base; a second lens to collimate the green light emitted from the second LD to generate collimated green light, the second lens being mounted on the base; a third lens to collimate the blue light emitted from the third LD to generate collimated blue light, the third lens being mounted on the base; and a package enclosing the first to third LDs and the first to third lenses. A feature of the optical module is that the collimated red light, the collimated green light, and the collimated blue light are aligned with an optical axis of the optical module to be generated as the multiplexed light.

BRIEF DESCRIPTION OF THE DRAWINGS

The foregoing and other purposes, aspects and advantages will be better understood from the following detailed description of a preferred embodiment of the invention with reference to the drawings, in which:

FIGS. 11A and 11B are plan and side views of the optical assembly shown in FIGS. 9 and 10;

DETAILED DESCRIPTION

Next, some embodiments according to the present application will be described as referring to drawings. In the description of the drawings, numerals or symbols same or similar to each other will refer to elements same or similar to each other without duplicated explanations.

First Embodiment

Figure 1:
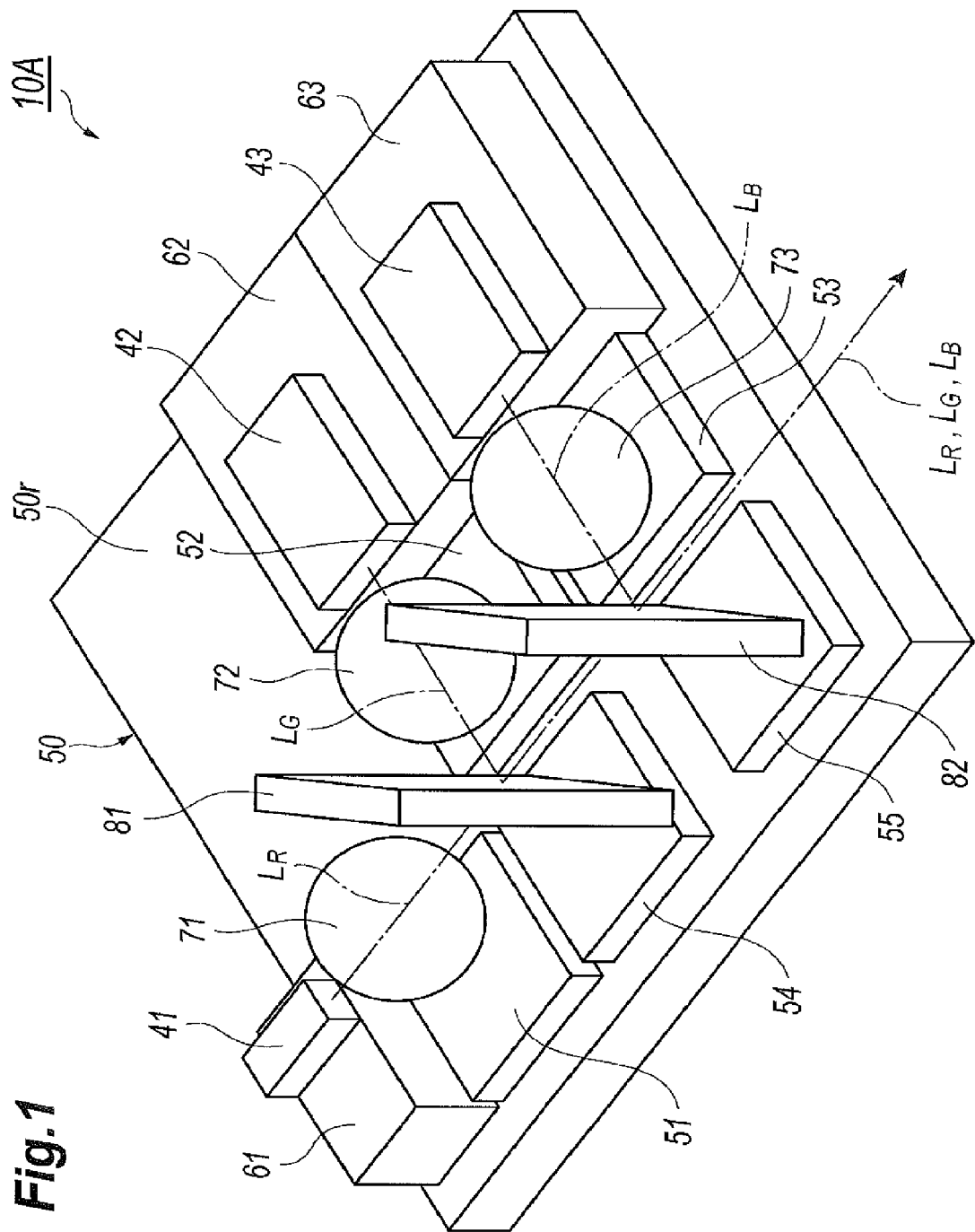
FIG. 1 is a perspective view of an optical assembly according to the first embodiment of the present application.

FIG. 1 is a perspective view of an optical assembly 10A according to the first embodiment of the present application. The optical assembly 10A multiplexes red light $L_R$, green light $L_G$, and blue light $L_B$. The optical assembly 10A comprises a red LD 41, a green LD 42, a blue LD 43, a first sub-mount 61, a second sub-mount 62, a third sub-mount 63, and a base 50 having a top surface 50r thereof.

The red LD 41, which is the first LD of the present embodiment, emits the red light $L_R$ whose wavelength is in a red range, for instance, the wavelength of the red light $L_R$ is 640 nm. The red LD 41 is mounted on the top surface 50r of the base 50 via the first sub-mount 61. The red LD 41 emits the light $L_R$ toward a direction along the top surface 50r.

The green LD 42, which is the second LD of the present embodiment, emits the green light $L_G$ whose wavelength is in a green range, for instance, the wavelength of the green light $L_G$ is 535 nm. The green LD 42 is also mounted on the top surface 50r of the base 50 via the second sub-mount 62. The green LD 42 emits the green light $L_G$ toward a direction along the top surface 50r.

The blue LD 43, which is the third LD of the present embodiment, emits the blue light $L_B$ whose wavelength is in a blue range, for instance, the wavelength of the blue light $L_B$ is 440 nm. The blue LD 43 is also mounted on the top surface 50r of the base 50 via the third sub-mount 63. The blue LD 43 emits the blue light $L_B$ toward a direction also along the top surface 50r.

In the present embodiment, thicknesses of respective sub-mounts, 61 to 63, are set such that an emitting point of the red LD 41 measured from the top surface 50r, that of the green red 42, and that of the blue LD 43 are substantially leveled to each other. That is, optical axes of the laser light, $L_R$, $L_G$, and $L_B$, are substantially leveled with respect to the top surface 50r. The sub-mounts, 61 to 63, are preferably made of materials whose thermal expansion coefficients are comparable to those of semiconductor materials constituting the LDs, 41 to 43. The sub-mounts, 61 to 63, are typically made of aluminum nitride (AlN), silicon carbide (SiC), silicon (Si), diamond (C), and so on. The LDs, 41 to 43, are fixed on respective sub-mounts, 61 to 63, by solder such as AuSn, SnAgCu, or electrically conductive resin such as silver (Ag) paste.

As shown in FIG. 1, the optical assembly 10A further comprises first to third lenses, 71 to 73; first to fifth sub-bases, 51 to 55; and first and second wavelength selective filters (WSF), 81 and 82. The first to third lenses, 71 to 73, which are mounted on the base 50 via respective sub-bases, 51 to 53, optically couple with the respective LDs, 41 to 43, and collimate the laser light, $L_R$, $L_G$, and $L_B$.

The first to third lenses, 71 to 73, align respective optical axes with the optical axes of respective LDs, 41 to 43. Specifically, when the sub-mounts, 61 to 63, have thicknesses of 0.15 mm and the emitting points of respective LDs, 41 to 43, measured from the back surfaces thereof, the level of the emitting points of respective LDs, 41 to 43, measured from the top surface 50r becomes 0.25 mm. Using the lenses, 71 to 73, having a diameter of 0.5 mm, the levels of the optical axes of the lenses, 71 to 73, measured from the bottom thereof become 0.25 mm. Thus, the levels of the optical axes of the LDs, 41 to 43, become equal to the levels of the optical axes of the lenses, 71 to 73; namely, the centers of the first to third lenses, 71 to 73.

The first WSF 81, which may be a type of the multi-layered filter formed on a glass substrate, is also mounted on the top surface 50r of the base 50 via the fourth sub-base 54. The first WSF 81 optically couples in one surface thereof with the first lens 71, while, in another surface thereof with the second lens 72. The first WSF transmits the red light $L_R$ emitted from the red LD 41 and collimated by the first lens 71; while, reflects the green light $L_G$ emitted from the green LD 42 and collimated by the second lens 72. The first WSF 81 is adjusted in an attitude thereof such that the optical axis of the red light $L_R$ transmitted through the first WSF 81 is aligned with the optical axis of the green light $L_G$ reflected thereby.

The second WSF 82, which may be also a type of the multi-layered filter providing layers stacked on a glass substrate, is mounted on the base 50 via the fifth sub-base 55. One surface of the second WSF 82 optically couples with the first WSF 81; while, another surface of the second WSF 82 optically couples with the third lens 73. The second WSF 82 transmits multiplexed light containing the red light $L_R$ and the green light $L_G$ output from the first WSF 81, where they are collimated by respective lenses, 71 and 72; while, reflects the blue light $L_B$ emitted from the blue LD 43 and collimated by the third lens 73. The second WSF 82 is adjusted in an attitude thereof such that the red and green light, $L_R$ and $L_B$, transmitted through the second WSF 82 are aligned with the blue light $L_B$ reflected thereby. The first and second WSFs, 81 and 82, are preferably in the centers thereof to the levels of respective light, $L_R$, $L_G$, and $L_B$.

The lenses, 71 to 73, and the WSFs, 81 and 82, are fixed to respective sub-bases, 51 to 55, by resin. The sub-bases, 51 to 55, are preferably made of materials whose thermal expansion co-efficient is comparable to that of the first to third lenses, 71 to 73, and that of the WSFs, 81 and 82. The sub-bases, 51 to 55, may be made of ceramics and/or metals. Also, the sub-bases, 51 to 55, preferably have an area enough to apply an ultraviolet curable resin to fix the lenses, 71 to 73, and the WSFs, 81 to 82, thereon. The sub-bases, 51 to 55, may have an area of 0.3 to 0.5 $mm^2$.

The optical assembly 10A thus described provides the red, green, and blue LDs, 41 to 43, each emitting red, green and blue light, $L_R$, $L_G$, and $L_B$, respectively. The red, green, and blue light, $L_R$, $L_G$, and $L_B$, are collimated by the first to third lenses, 71 to 73. The first WSF 81 multiplexes the red light $L_R$ with the green light $L_G$, while, the second WSF 82 multiplexes the red and green light, $L_R$ and $L_G$, with the blue light $L_B$. The light thus multiplexed by two WSFs, 81 and 82, is output from the optical assembly 10A along the optical axis thereof.

Next, a method to assemble the optical assembly 10A will be described as referring to FIGS. 2 to 6, where FIGS. 2 to 6 schematically show processes to assemble the optical assembly 10A, in particular, processes to align the LDs, 41 to 43, the lenses, 71 to 73, and two WSFs, 81 and 82.

Figure 2:
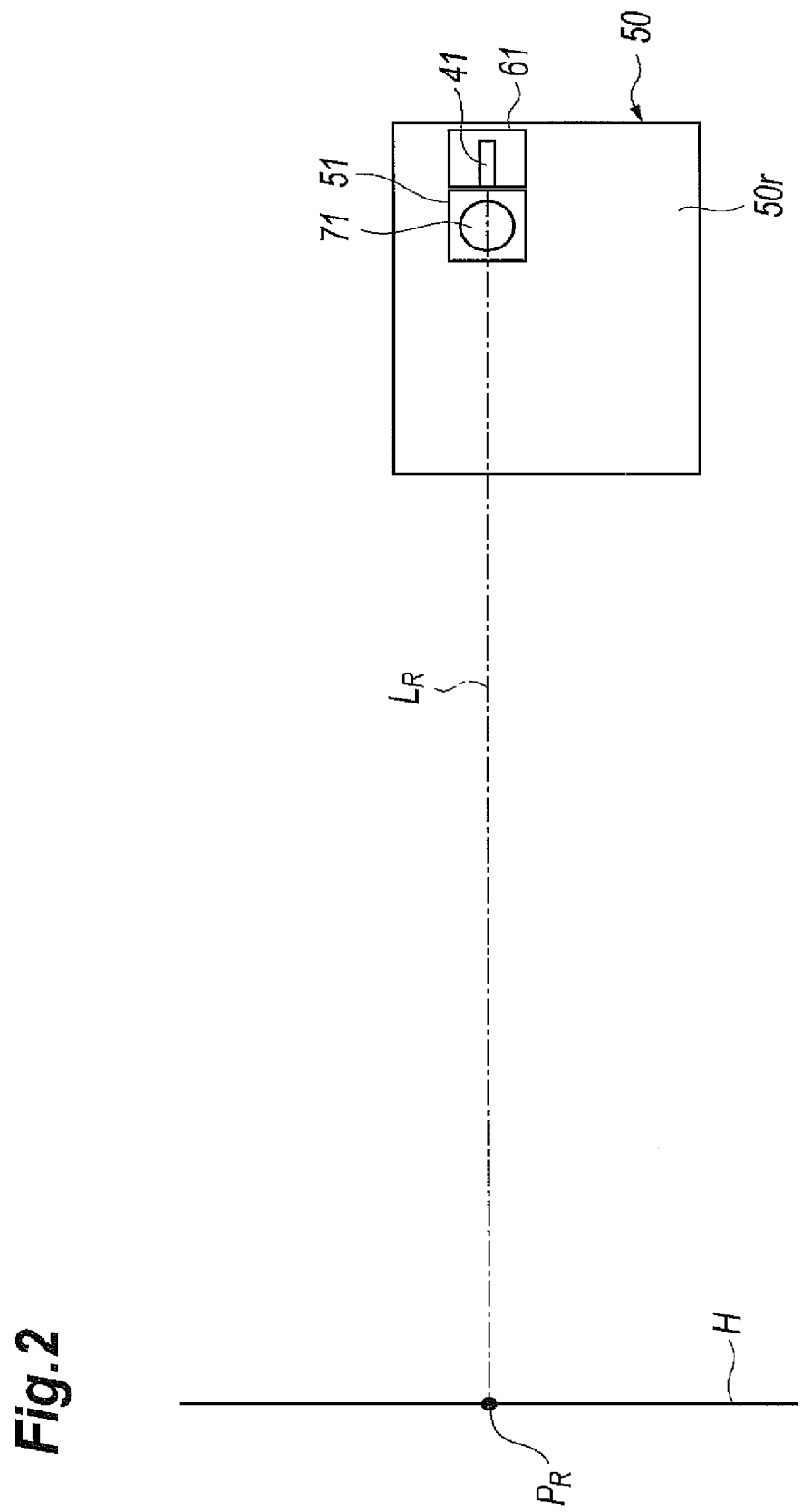
FIG. 2 schematically illustrates a process to align a red LD and a first lens on the base.
Figure 3:
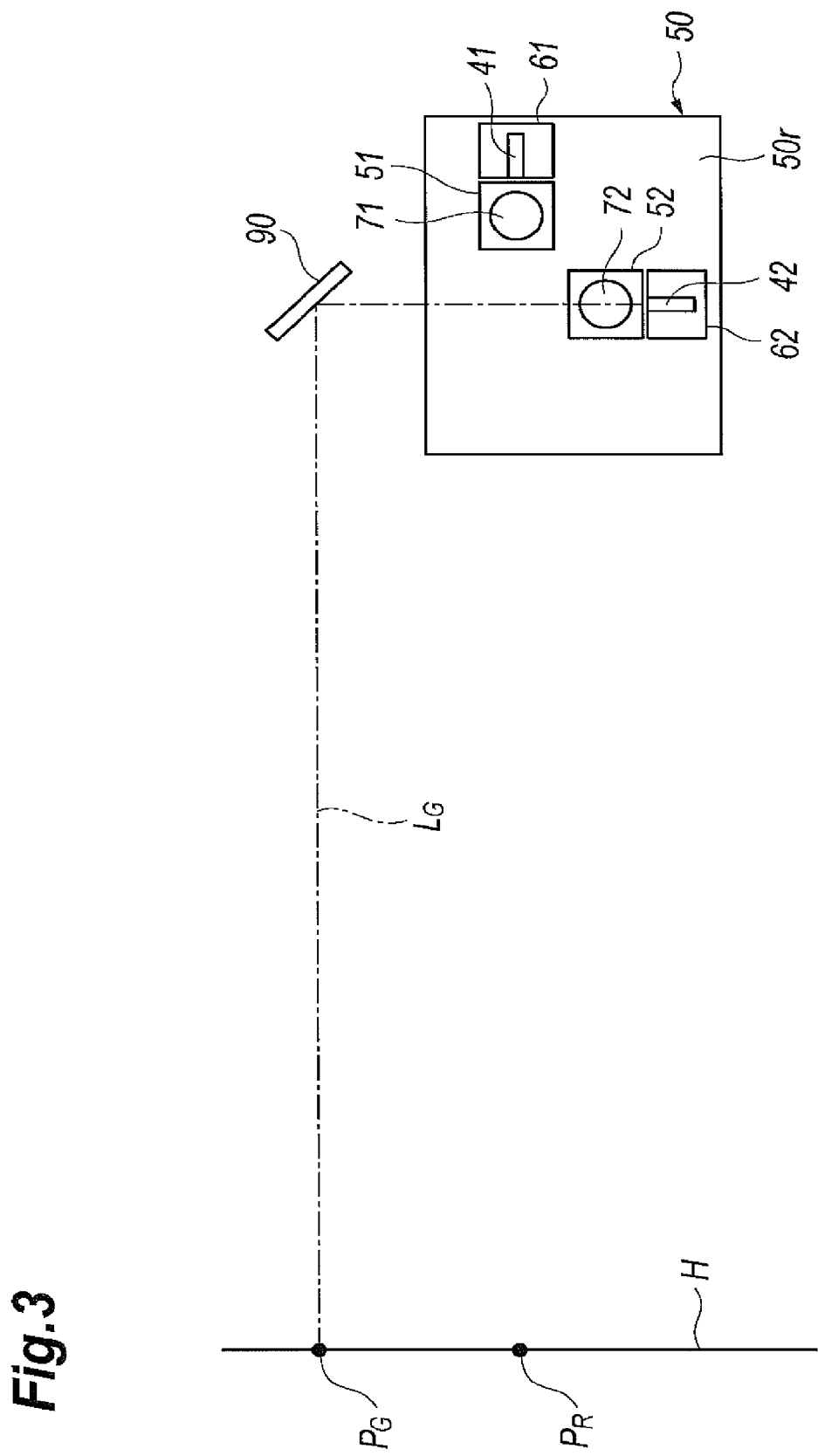
FIG. 3 schematically illustrates a process to align a green LD and the second lens on the base.
Figure 4:
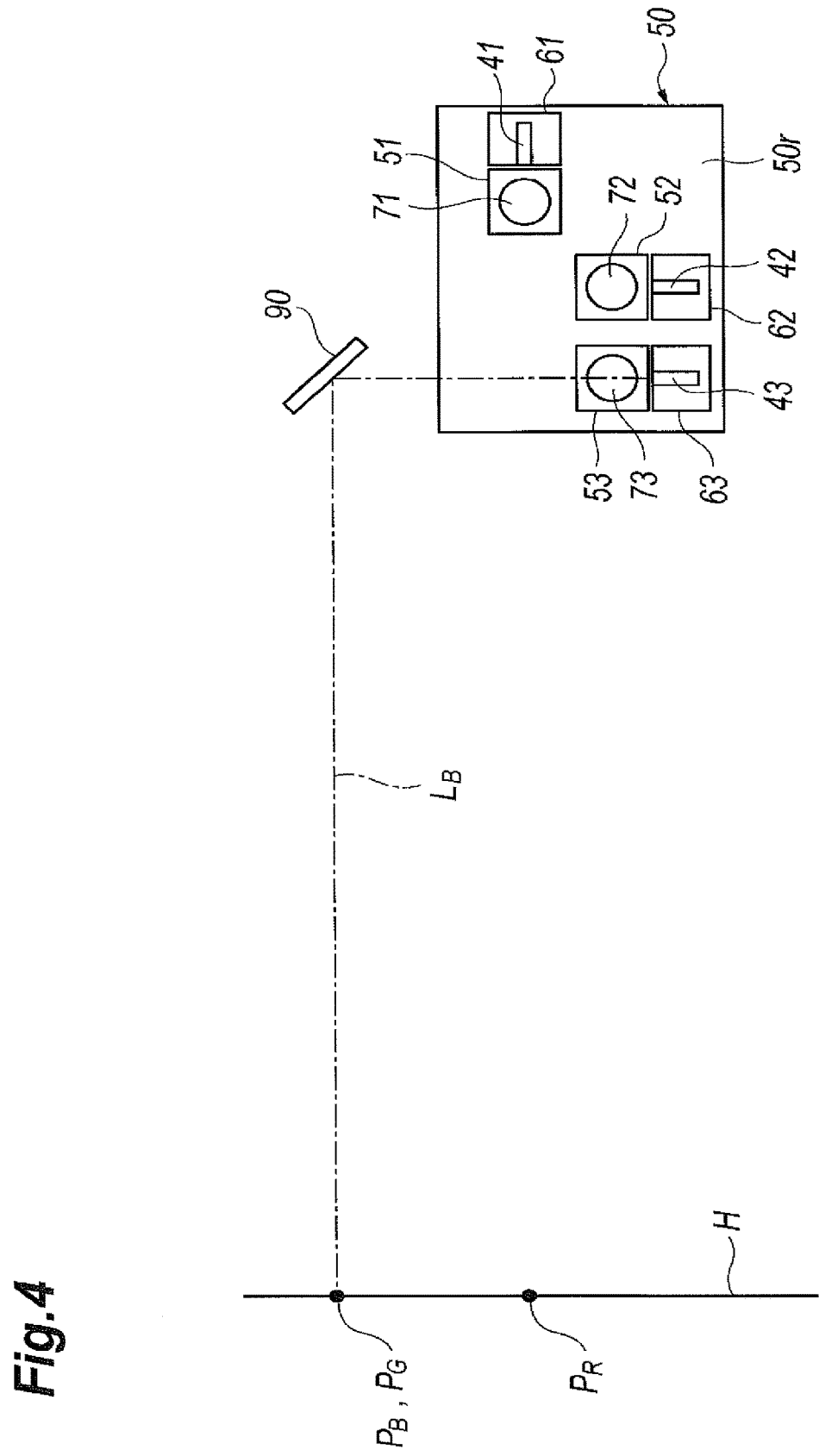
FIG. 4 schematically illustrates a process to align a blue LD and the third lens on the base.

The process first mounts the red LD 41 on the top surface 50r of the base 50 via the first sub-mount 61, and the first lens 71 via the first sub-base 51 as the optical alignment of the red LD 41 and the first lens 71 is performed such that the red light $L_R$ emitted from the red LD 41 projects on the first point $P_R$ on a screen H, as schematically illustrated in FIG. 2.

Specifically, the die-bonding mounts and fixes the red LD 41 onto the sub-mount 61. First, as the red LD 41 is practically activated, the first lens 71 is aligned vertically perpendicular to the top surface 50r such that the red light $L_R$ emitted from the red LD 41 advances along a direction substantially parallel to the top surface 50r of the base 50; then, the first lens 71 is fixed on the sub-base 51. In one specific example, the first sub-base 51 applied with ultra-violet curable resin on a surface thereof in advance to place the first lens 71 practically, and the first lens 71, as being held by a vacuum collet and securing a thickness of the resin, is vertically aligned. Thus, the first lens 71 may adjust an elevation and/or depression angle of the optical axis of the red light $L_R$ against the top surface 50r of the base 50. Further specifically, setting two CCD (Charge-Coupled Device) cameras on a virtual plane enough apart from the base 50 by, for instance, one (1) meter and another virtual plane apart from the former virtual plane by, for instance, two (2) meters; the first lens 71 may be adjusted in the vertical level thereof such that the red light $L_R$ projecting on the former virtual plane and on the latter virtual plane have levels substantially identical with the levels of the top surface 50r of the base 50. Because the red light $L_R$ passes the first lens 71 becomes a substantially parallel beam, which facilitates the measurement by the CCDs even on respective virtual planes enough apart from the base 50. After the alignment of the first lens 71, the first lens 71 is permanently fixed to the sub-base 51 by curing the ultra-violet curable resin.

The process next assemble the green LD 42 on the top surface 50r of the base 50 via the second sub-mount 62, and the second lens 72 via the second sub-base 52, as shown in FIG. 2. In this process, the green LD 42 and the second lens 72 are arranged such that the green light $L_G$ emitted from the green LD 42 and passes the second lens 72 projects on the second point $P_G$ whose level of equal to the level of the top surface 50r of the base 50 and that of the first point $P_R$ on the plane H.

Specifically, the die-bonding first fixes the green LD 42 on the second sub-mount 62. Then, setting a mirror 90 on an optical axis of the green LD 42 such that a reflecting surface of the mirror 90 makes an angle of 45° against the optical axis of the green light $L_G$; practically activating the green LD 42, the green light $L_G$ is projected on a virtual plane H. Adjusting a level of the second lens 72 in manners same with those for the first lens 71 and such that the level of the second point $P_G$ measured from the top surface 50r becomes equal to the level of the first point $P_R$, the green light $L_G$ in the optical axis thereof becomes substantially in parallel to the top surface 50r of the base 50 and has the level same as the level of the red light $L_R$. After the alignment, the second lens 72 is fixed to the second sub-base 52 by curing the resin. During the process described above, the point $P_G$ for the green light $L_G$ is unnecessary to overlap with the point $P_R$.

The process next assembles the blue LD 43 and the third lens 73. The blue LD 43 is also mounted on the top surface 50r of the base 50 via the third sub-mount 63 by a manner same with those described above, and the third lens 73 is aligned on the top surface 50r via the third sub-base 53 also by a manner similar to those for the red LD 41 and the green LD 42. Specifically, the blue LD 43 and the third lens 73 are aligned such that the blue light $L_B$ passing the third lens 73 projects on the third point $P_B$ on the virtual plane H. The position of the third point $P_B$ on the virtual plane H overlaps with the position of the point $P_G$ for the green LD 42.

Specifically, the ordinary die-bonding first the blue LD 43 on the third sub-mound 63. The mirror 90 is set on the optical axis of the blue light $L_B$ such that the reflecting surface thereof makes an angle of 45° against the optical axis of the blue light $L_B$. Practically activating the blue LD 43, the blue light $L_B$ emitted from the blue LD 43 projects on the point $P_B$ on the virtual plane H. Adjusting the level of the third lens 73 such that the point $P_B$ of the blue light $L_B$ on the virtual plane H has a level same as those of the first point $P_R$ for the red light $L_R$ and the second point $P_B$ for the green light $L_G$, and the position of the point $P_B$ overlaps with the second point $P_G$, the blue light $L_B$ in the optical axis thereof becomes parallel to the top surface 50r of the base 50 and that of the green light $L_G$. After the alignment, the third lens 73 is fixed to the third sub-base 53 by curing the resin.

Figure 5:
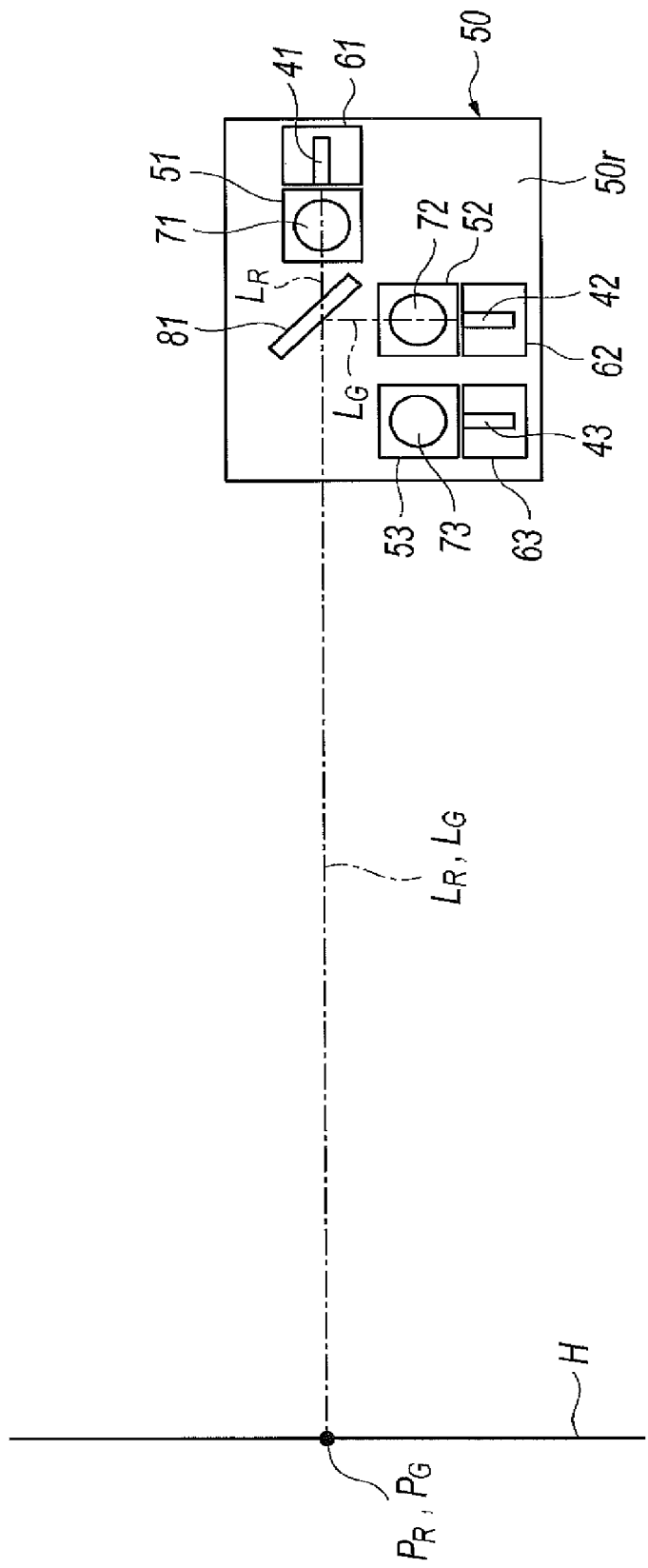
FIG. 5 schematically illustrates a process to align a first wavelength selective filter with the red and green LDs on the base.
Figure 6:
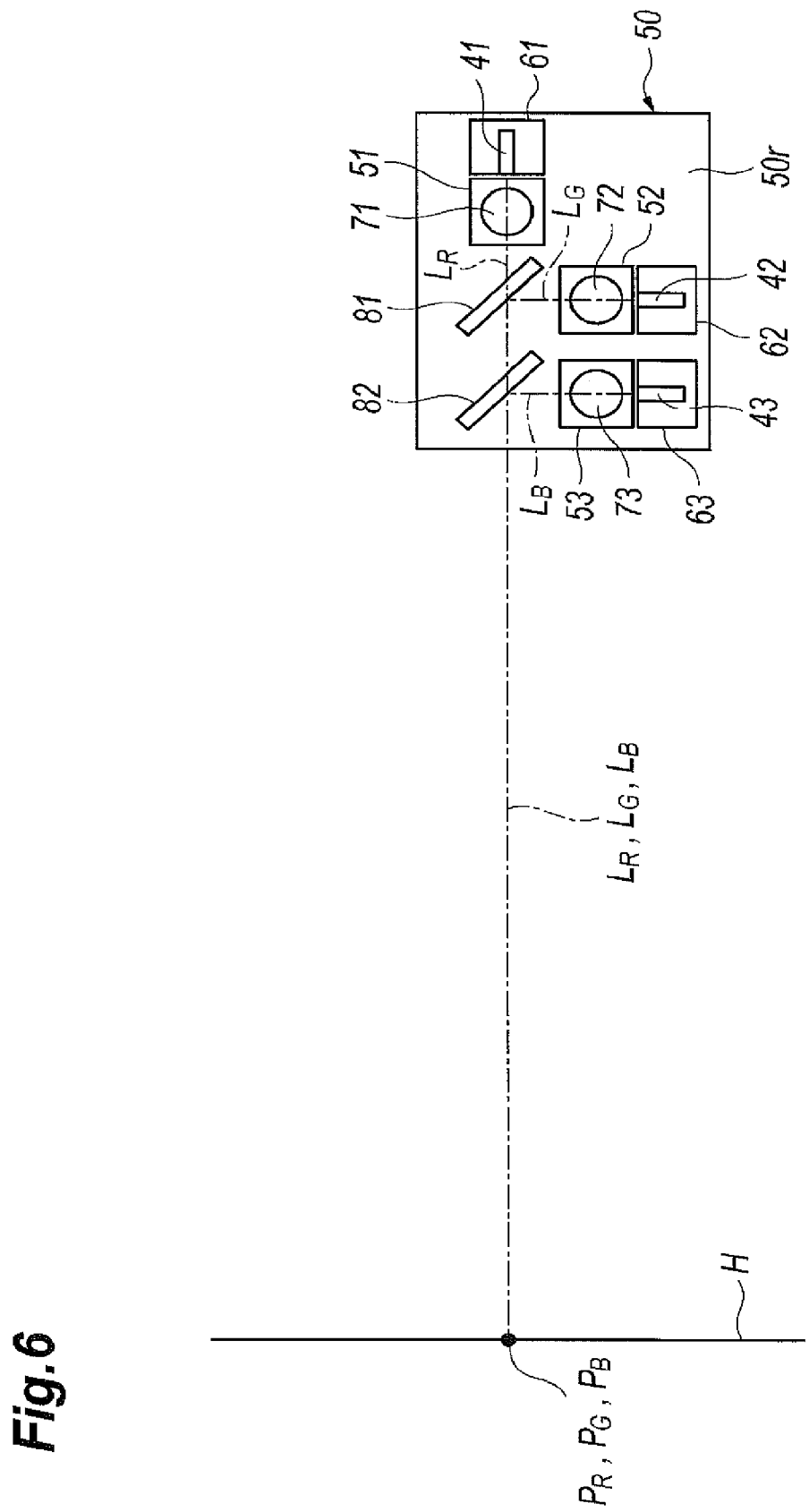
FIG. 6 schematically illustrates a process to align a second wavelength selective filter with the blue LD.

The process next assemble the first WSF 81 on the top surface 50r of the base 50 so as to overlap the second point $P_G$ with the first point $P_R$ on the virtual plane H, as shown in FIG. 5. Specifically, setting the first WSF 81 on the optical axis of the green light $L_G$ to reflect the green light $L_G$ on the virtual plane H, and adjusting the rotation angle against the optical axis of the green light $L_G$ and the elevation/depression angle against the top surface 50r; the second point $P_G$ overlaps with the first point $P_R$. Two CCD cameras used in the alignment of the red LD 41 and the first lens 71 are preferably utilized to align the first WSF 81. The vertical position of the points, $P_R$ and $P_G$, are adjustable by varying the elevation/depression angle of the first WSF 81; while, the horizontal position thereof are adjustable by rotating the first WSF 81. Although the first position $P_R$ for the red light $L_R$ not only the second point $P_G$ for the green light $L_B$ varies the projecting position thereof as rotating, elevating, and/or depressing the first WSF 81, a condition at which the first point $P_R$ fully overlaps with the second point $P_G$ certainly exists. After the alignment of the first WSF 81, the resin on the fourth sub-base 54 for the first WSF 81 is cured by irradiating ultraviolet lays.

Next, the second WSF 82 is aligned and fixed on the top surface 50r of the base 50 via the fifth sub-base 55. The second WSF 82 is aligned such that the third point $P_B$ on the virtual plane H for the blue light $L_B$ overlaps with the first and second points, $P_R$ and $P_G$, on the plane H by a manner similar to those for the first WSF 81 by rotating, elevating, and/or depressing the second WSF 82.

Next, advantages of the optical assembly 10A and the assembling method described above will be explained. Generally, a material used for an optical lens in refractive index thereof has wavelength dependence. Accordingly, when laser light output from respective LDs, 41 to 43, is collimated by a single lens, which causes the chromatic aberration, an image formed by the light diffuses. The present optical assembly 10A implements with three lenses, 71 to 73, corresponding to respective LDs, 41 to 43, accordingly, the chromatic aberration is effectively suppressed.

In another aspect, an optical assembly has been continuously and eagerly requested to make a size thereof compact. When an optical assembly implements three lenses within a compact housing; the lenses are necessary to be closely arranged, which brings various problems. For instance, resins to fix the optical components are oozed out to areas for neighbor components to disarrange or misalign the optical conditions of the components.

Although the optical assembly 10A of the present embodiment provides three LDs, 41 to 43, and three lenses, 71 to 73, each corresponding to the LDs, 41 to 43, the lenses, 71 to 73, are mounted on the top surface 50r via respective sub-bases, 51 to 53, independent of each other. In such an arrangement, even the resin oozes out to the neighbor areas, the oozed resin could not rise up the sub-bases, 51 to 53, not to affect the optical conditions of the components. The shift or the offset of the optical axes of the light, $L_R$, $L_G$, and $L_B$, may be stably and effectively suppressed.

Also, the process to assembly the optical assembly 10A of the present embodiment firstly mounts the red LD 41 of the base 50 (first step), secondly mounts the green LD 42 on the base 50 so as to level the projecting point $P_G$ with respect to the projecting point $P_R$ for the red light $L_R$ (second step), thirdly mounts the blue LD 43 on the base 50 so as to level the projecting point $P_B$ for the blue light $L_B$ with respect to the former two points, $P_R$ and $P_G$, (third step), and two WSFs, 81 and 82, are finally mounted on the base 50 so as to overlap the second and third projecting points, $P_G$ and $P_B$, for the green and blue light, $L_G$ and $L_B$, with the first projecting point $P_R$ for the red light $L_R$. Thus, the optical axes of the light, $L_R$, $L_G$, and $L_B$, are precisely and easily aligned.

The arrangement of the present embodiment disposes the green LD 42 and the blue LD 43 in the same side with respect to the optical axis of the red light $L_R$. That is, two projecting points, $P_G$ and $P_B$, may be overlapped on the plane H in the third step to align the third lens 73, which facilitates the alignment of the blue LD 43 and the third lens 73. Moreover, in such an arrangement for the green and blue LDs, 42 and 43, two WSFs, 81 and 82, may be substantially in parallel to each other, which also facilitates the optical alignment of two WSFs, 81 and 82.

Second Embodiment

Figure 7:
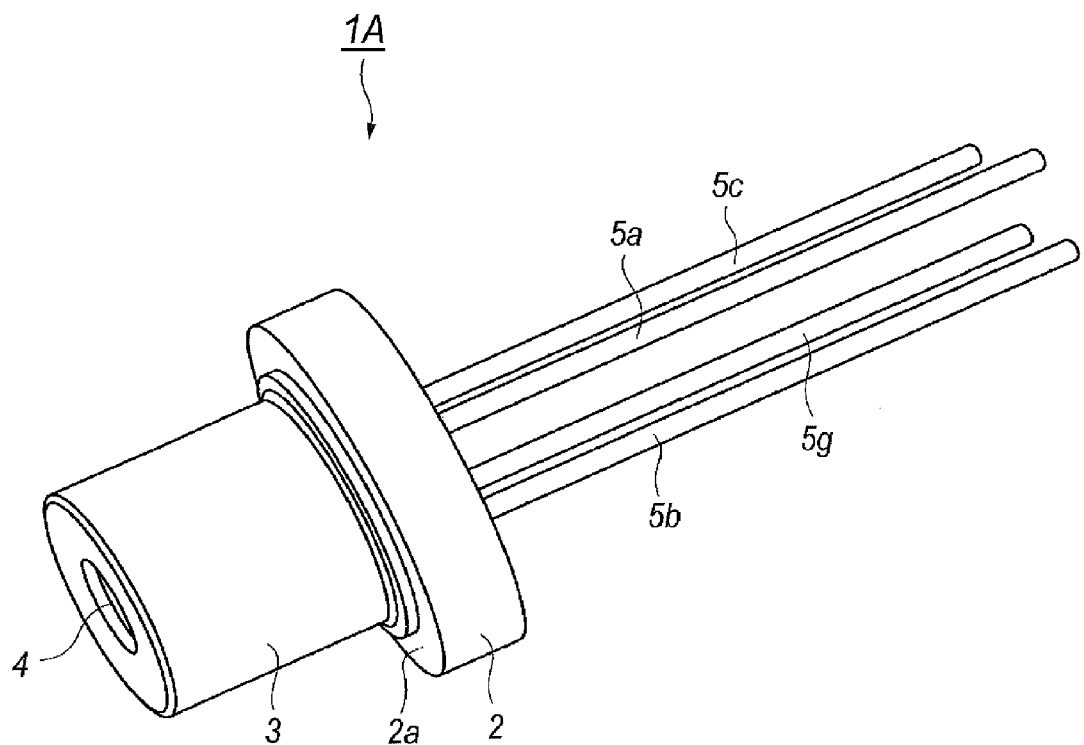
FIG. 7 is an outer appearance of an optical module installing the optical assembly according to an embodiment of the present application.
Figure 8:
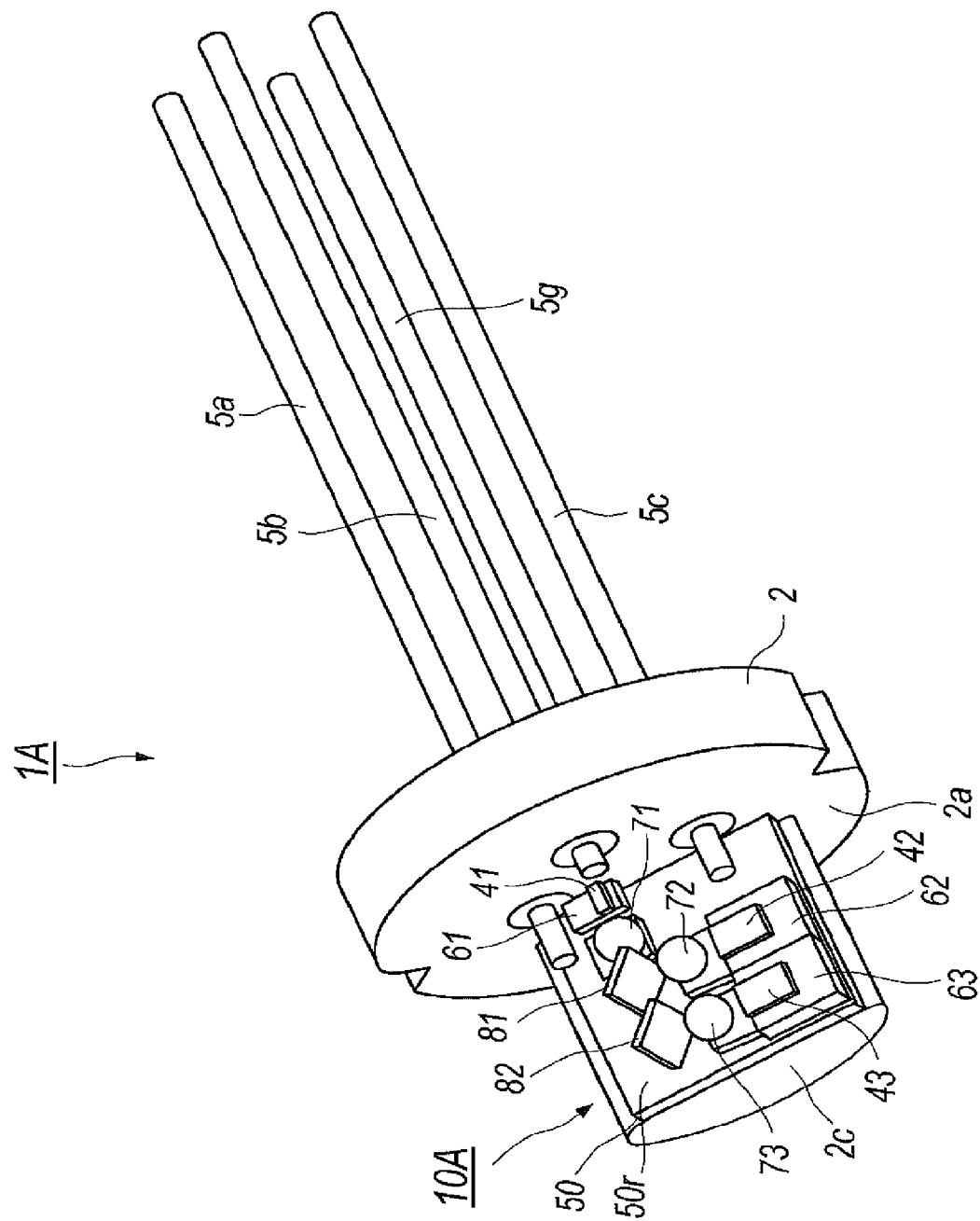
FIG. 8 is a perspective view showing an inside of the optical module shown in FIG. 7.

Next, the second embodiment of the present application will be described, where the second embodiment is a type of an optical module implemented with an optical assembly 10A described above. FIG. 7 shows an outer appearance of the optical module 1A, while, FIG. 8 shows an inside of the optical module 1A by omitting a cap 3. The optical module 1A has a CAN package of, what is called, a co-axial package.

The optical module 1A comprises, in addition to the optical assembly 10A, a stem 2, a cap 3, a condenser lens 4, and lead terminals, 5a to 5g. The cap 3 holds the condenser lens 4 that concentrates the multiplexed light containing the red $L_R$, green $L_G$ and the blue light $L_B$, output from the optical assembly 10A. The condenser lens 4 is aligned in the optical axis thereof with the optical axis of the light, $L_R$, $L_G$, and $L_B$. The stem 2 has a diameter of 5.6 mm and the lead terminals, 5a to 5g, protruding from the primary surface 2a of the stem 2. Three of lead terminals, 5a to 5c, are electrically isolated from the stem 2, but the rest lead terminal 5g is directly connected to the stem 2.

The base 50 of the optical assembly 10A is fixed to the stem 2. Specifically, the stem 2 provides a block 2c protruding from the primary surface 2a, and the base 50 of the optical assembly 10A is mounted on a side of the block 2c such that the top surface 50r vertically extends with respect to the primary surface 2a of the stem 2. The optical assembly 10A is air-tightly enclosed in a space formed by the stem 2 and the cap 3. The LDs, 41 to 43, on the base 50 in top electrodes thereof are electrically connected to respective lead terminals, 5a to 5c; while, in the bottom electrodes thereof are connected to the lead terminal 5g via respective sub-mounts, 61 to 63, the base 50, and the stem 2.

Because the optical module 1A installs the optical assembly 10A that implements three LDs, 41 to 43, and three lenses, 71 to 73, on the base 50 in an optically aligned state, the multiplexed light emitted therefrom is effectively concentrated by the condenser lens 4 held in the cap 3. Moreover, the base 50 mounts those components, 41 to 43, 71 to 73, 81 and 82, the optical module 1A may be formed in compact as the diameter thereof is only 5.6 mm.

Third Embodiment

Figure 9:
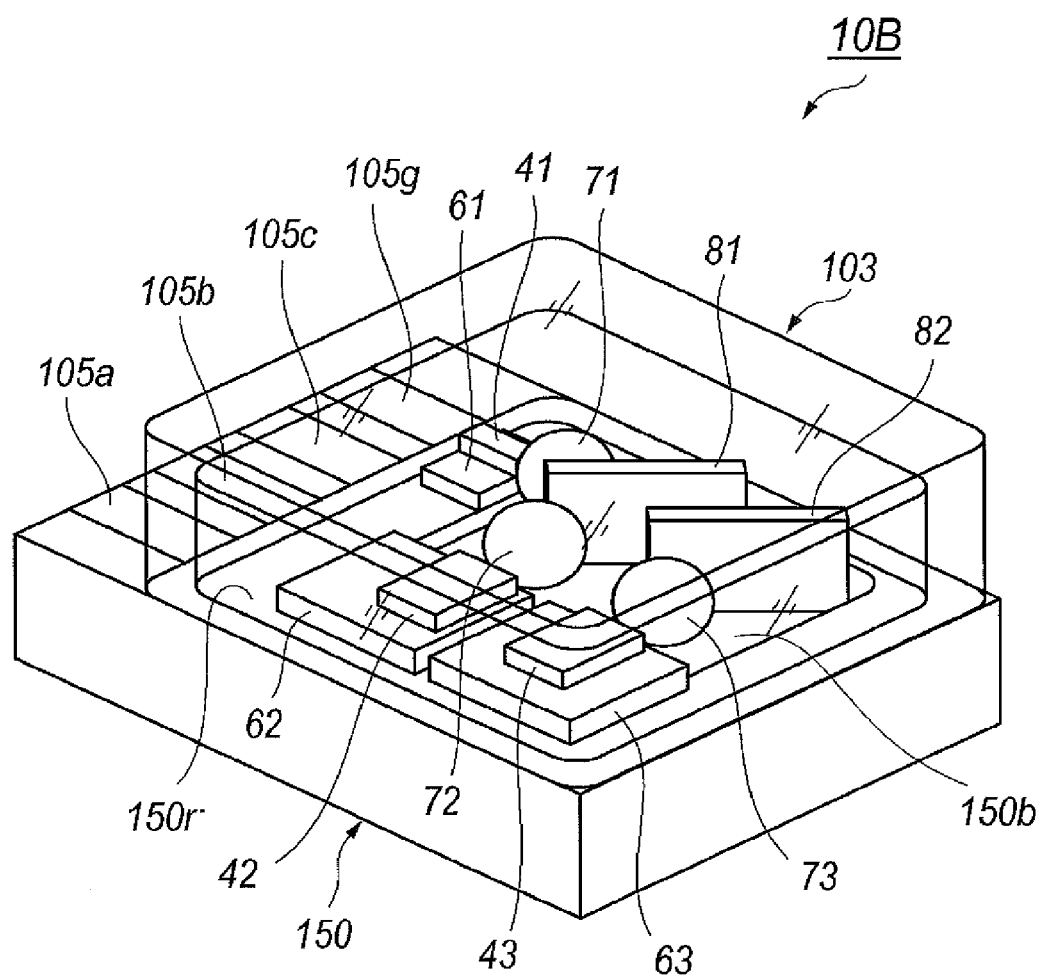
FIG. 9 is a perspective view of an optical assembly according to another embodiment of the present application.
Figure 10:
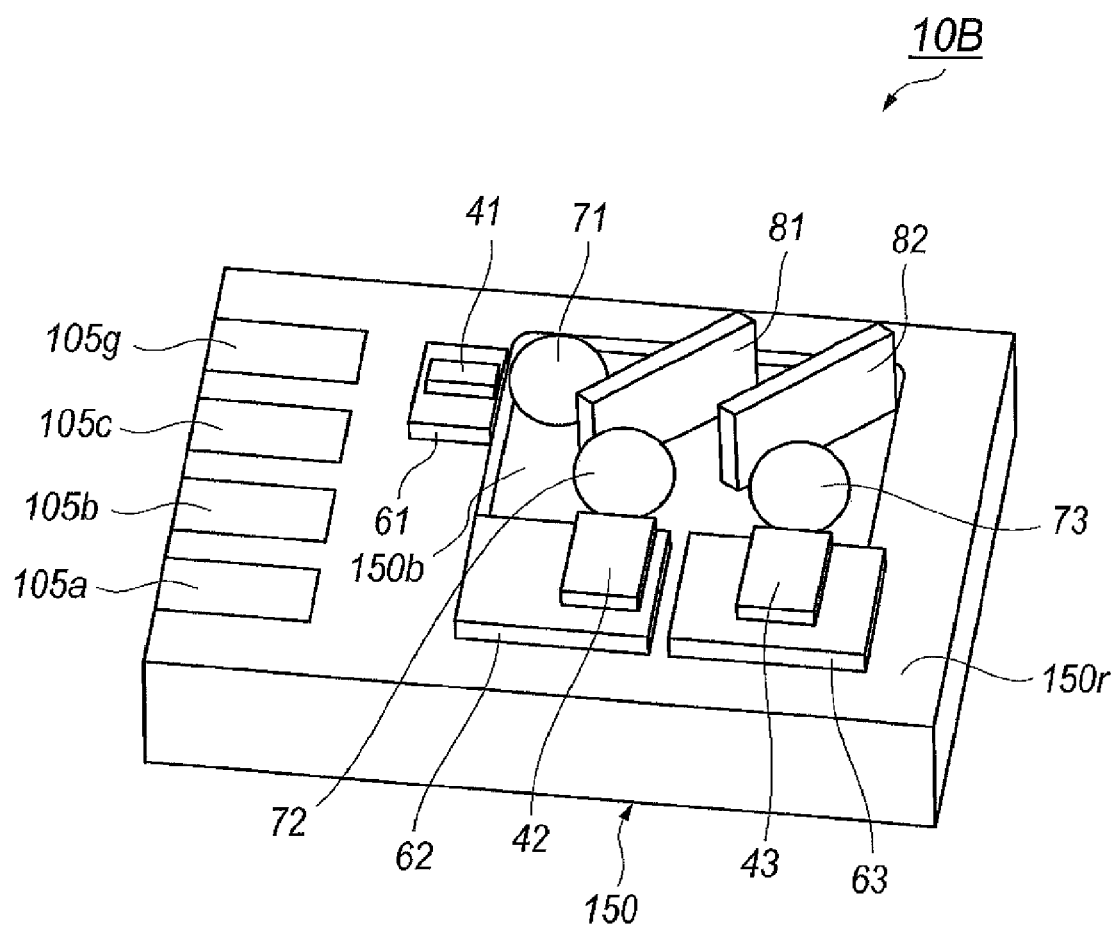
FIG. 10 shows an inside of the optical assembly shown in FIG. 9.

FIG. 9 is a perspective view of an optical assembly 10B according to another embodiment of the present application, FIG. 10 removes a cap 103, which is transparent to the light, $L_R$, $L_G$, and $L_B$, output from the optical assembly 10B shown in FIG. 9, and FIGS. 11A and 11B are the plan and side views of the optical assembly 10B.

The optical assembly 10B provides, in addition to components implemented within the optical assembly 10A, a substrate 150 instead of the base 50 and a cap 103 made of material transparent to the light, $L_R$, $L_G$, and $L_B$. The substrate 150, which provides a top surface 150r corresponding to the top surface 50r of the base 50 of the aforementioned embodiments, mounts the optical assembly 10A including three LDs, 41 to 43, each mounted on respective sub-mounts, 61 to 63, three lenses, 71 to 73, and two WSFs, 81 and 82. A feature of the optical assembly 10B is that the substrate 150 provides, in the top surface 150r thereof, a hollow 150b into which the lenses, 71 to 73, and two WSFs, 81 and 82, are mounted. FIGS. 9 to 11 omit the sub-bases, 51 to 55, set under the lenses, 71 to 73, and two WSFs, 81 and 82.

The substrate 150 provides lead terminals 105a to 105g on the top surface 150r thereof. These lead terminals, 105a to 105g, are wired at positions close to respective LDs, 41 to 43, and electrically connected to LDs, 41 to 43. In an example, the substrate 150 has a rectangular plane shape with an area of 5.5×3.5 mm². An area of 2×3.5 mm, namely, an end of a longitudinal side, is provided for the lead terminals, 105a to 105g; while, the rest area installs the optical assembly 10A. The transparent cap 103 has a thickness of, for instance, 1 mm to cover the optical assembly 10A air-tightly. In a modification of the optical assembly 10B, the cap 103 may be made of material opaque to the light, $L_R$, $L_G$, and $L_B$, but providing a window to pass the light, $L_R$, $L_G$, and $L_B$. The opaque material may be ceramics.

The optical assembly 10B implements the optical assembly 10A therein in a state where the optical alignment for three LDs, 41 to 43, three lenses, 71 to 73, and two WSFs, 81 and 82, are completed. The light, $L_R$, $L_G$, and $L_B$, output from the optical assembly 10A is precisely aligned and easily concentrated by a condenser lens set outside of the optical assembly 10B. Thus, the optical assembly 10B may be formed in compact.

Fourth Embodiment

Figure 12:
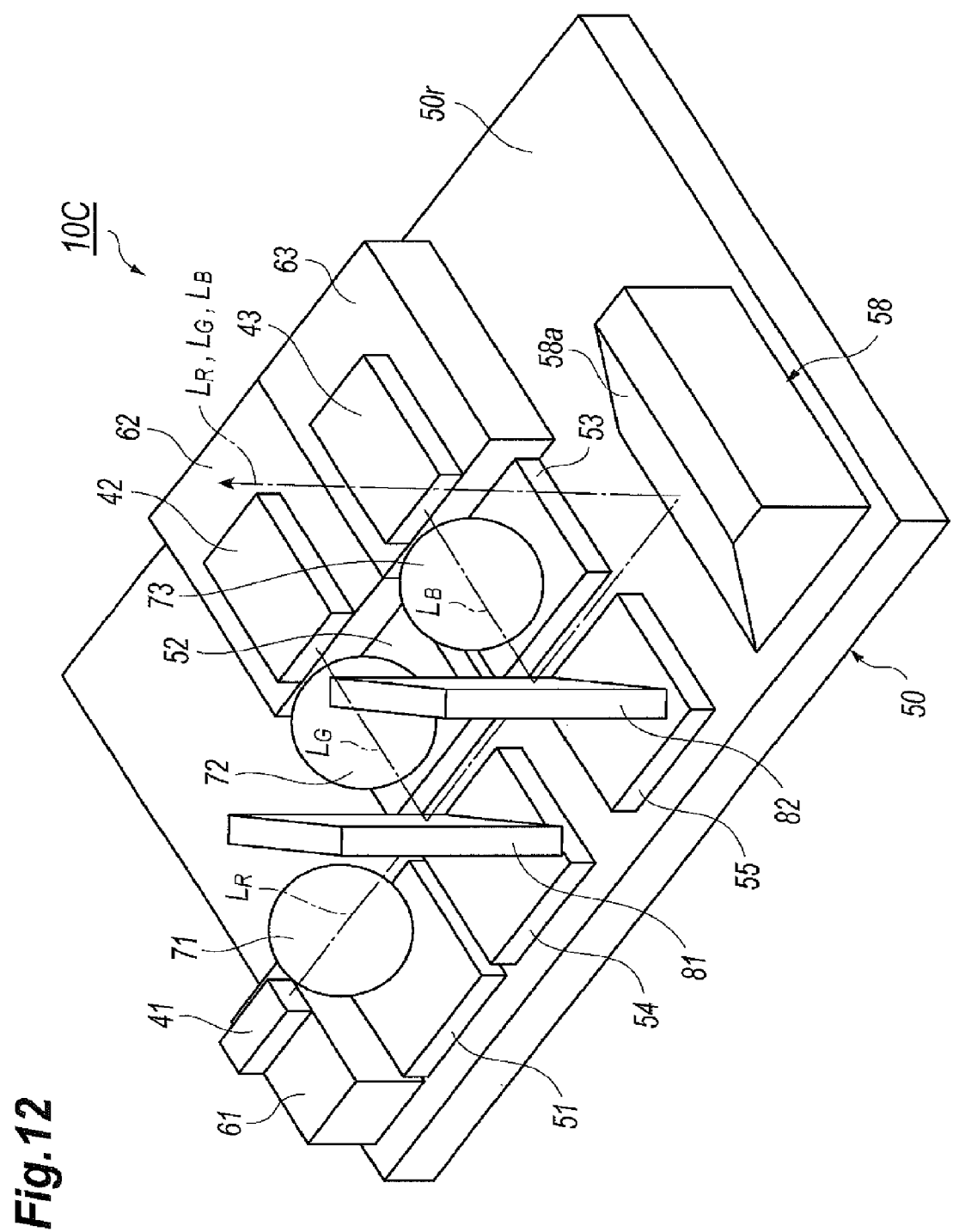
FIG. 12 is a perspective view of an optical assembly according to still another embodiment of the present application.

FIG. 12 is a perspective view of another optical assembly 10C according to fourth embodiment of the present application. The optical assembly 10C provides, in addition to the arrangement of the aforementioned optical assembly 10A, a mirror 58 on the base 50. Arrangements except for the mirror 58 are same as those of the aforementioned embodiment 10A.

The mirror 58, which is mounted on the top surface 50r of the base 50, provides an inclined surface 58a that reflects the light, $L_R$, $L_G$, and $L_B$, upward with respect to the top surface 50r. That is, the inclined surface 58a makes an angle of substantially 45° against the top surface 50r. Accordingly, light entering the inclined surface 58a is reflected to the direction normal to the top surface 50r.

Figure 13:
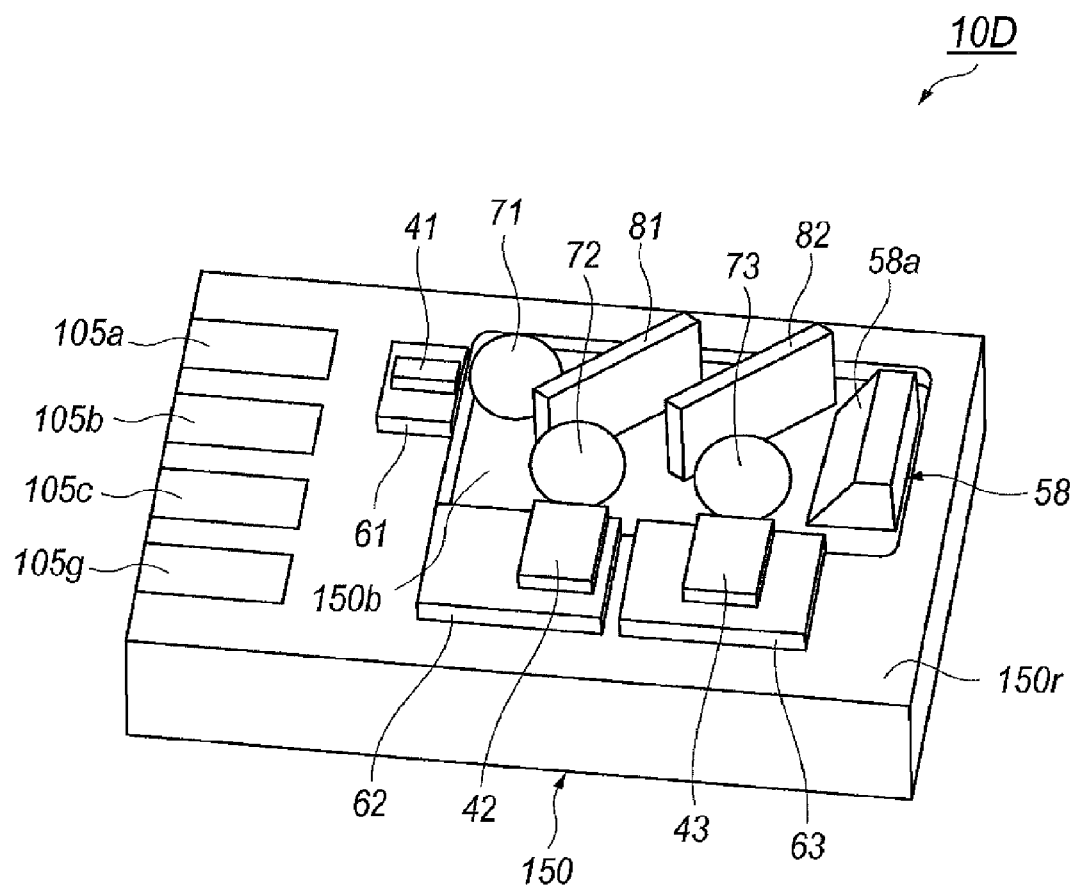
FIG. 13 is a perspective view of an optical assembly modified from the optical assembly shown in FIG. 12.

FIG. 13 is a perspective view of another optical assembly 10D, which is similar to those of the aforementioned assemblies, 10B and 10C. That is, the optical assembly 10D provides the mirror 58 within the hollow 150b on the top surface 150r of the substrate 150. The light, $L_R$, $L_G$, and $L_B$, reaching the mirror 58 is reflected to the direction normal to the top surface 150r and passes the transparent cap 103.

Figure 14:
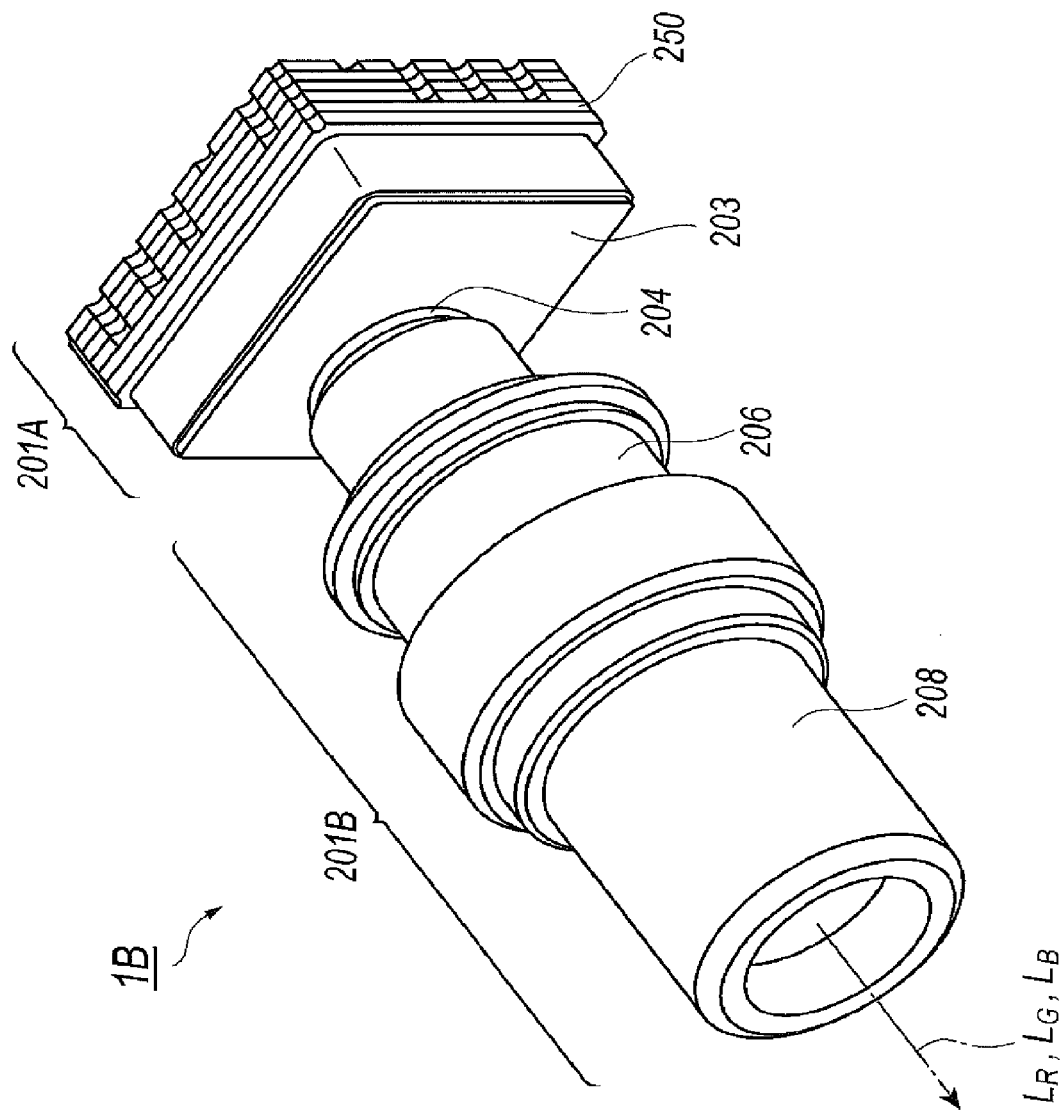
FIG. 14 shows an outer appearance of an optical module according to an embodiment of the present application.
Figure 15:
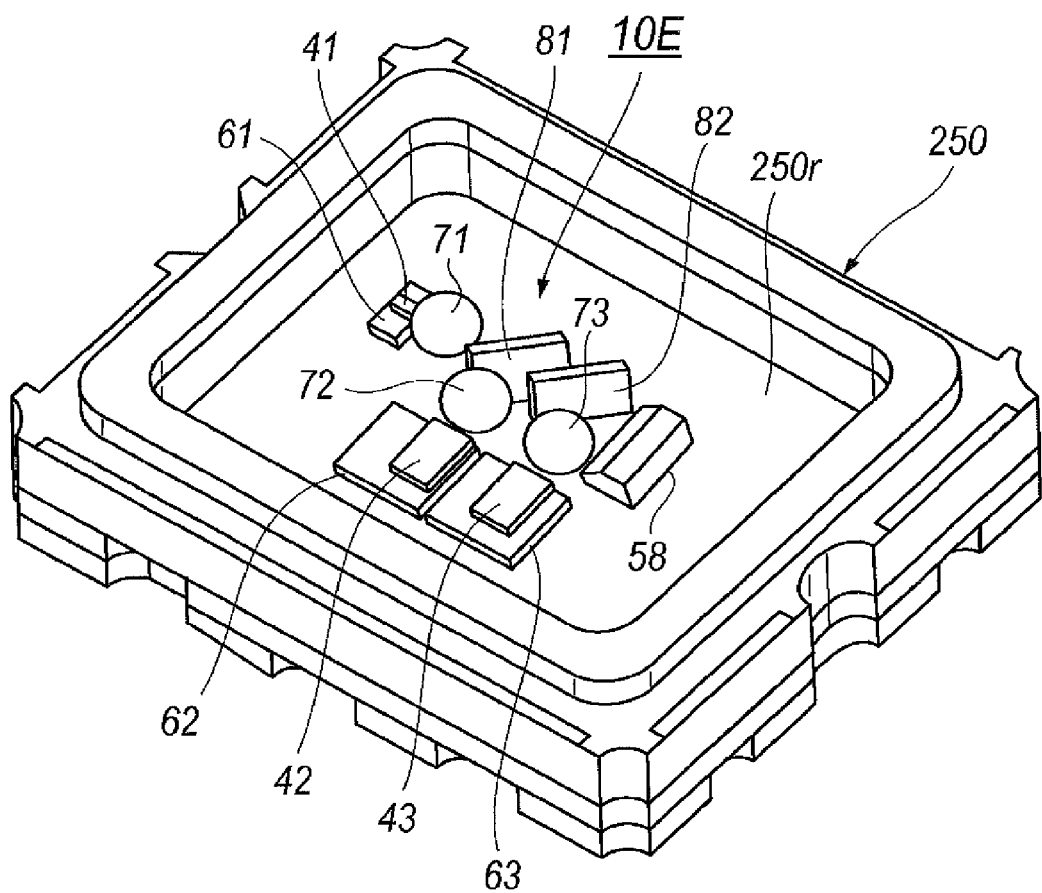
FIG. 15 shows an inside of the optical module shown in FIG. 14.

FIG. 14 is a perspective view showing one type of optical module 1B that installs optical assemblies, 10C to 10D; while, FIG. 15 shows an inside of the optical module 1B. The optical module 1B comprises an optical device 201A and an optical coupling portion 201B. The optical device 201A has a package 250, which encloses the optical assembly 10C shown in FIG. 12, made of ceramics such as aluminum oxide and having dimensions of 4.0×4.7×1.5 mm³. As shown in FIG. 15, the bottom 250r of the package 250 operates as the top surface 50r of the aforementioned embodiments that mounts the optical components, 41 to 43, 71 to 73, 81, 82, and 58 thereon. The multiplexed light containing three beams, $L_R$, $L_G$, and $L_B$, is emitted to the direction normal to the bottom 250r after reflected by the mirror 58. FIG. 15 removes the sub-bases, 51 to 55, to mount lenses, 71 to 73, and two WSFs, 81 and 82.

The optical device 201A further includes a metal ceiling 203 integrally formed with a lens holder 204 in a center of the ceiling 203. The lens holder 204 extends along the optical axis of the multiplexed light and has a cylindrical shape. The lens holder 204 is assembled with a joint 206 of the coupling portion 201B. The joint 206 also has a cylindrical shape. That is, the joint 206 is mated with or receives the lens holder 204 and has a bore to pass the multiplexed light. The joint 206 fixes the sleeve 208 that receives a ferrule secured in a tip of an external fiber. FIG. 14 omits the ferrule and the external fiber. The sleeve 208 has a function of an optical receptacle, that is, inserting an optical connector into the sleeve 208 and sets up a scanning mechanism in the other end of the external fiber, a head-mountable display having an extremely compact housing may be realized. The optical module 1B shown in FIG. 14 thus provides the optical coupling portion 201B having the sleeve 208; however, the optical module 1B provides, instead of the optical sleeve 208, an optical fiber rigidly and permanently fixed to the optical device 201A, which is often called as the pig-tailed arrangement.

The optical module 1B of the present embodiment provides an optical assembly, 10C to 10E, primary part of which reflects the arrangement of the optical assembly, 10A and/or 10B; accordingly, the multiplexed light containing the red light $L_R$, the green light $L_G$, and the blue light $L_B$, is optically aligned in the optical axes thereof precisely. The optical module 1B may be formed in compact.

Fifth Embodiment

Figure 16:
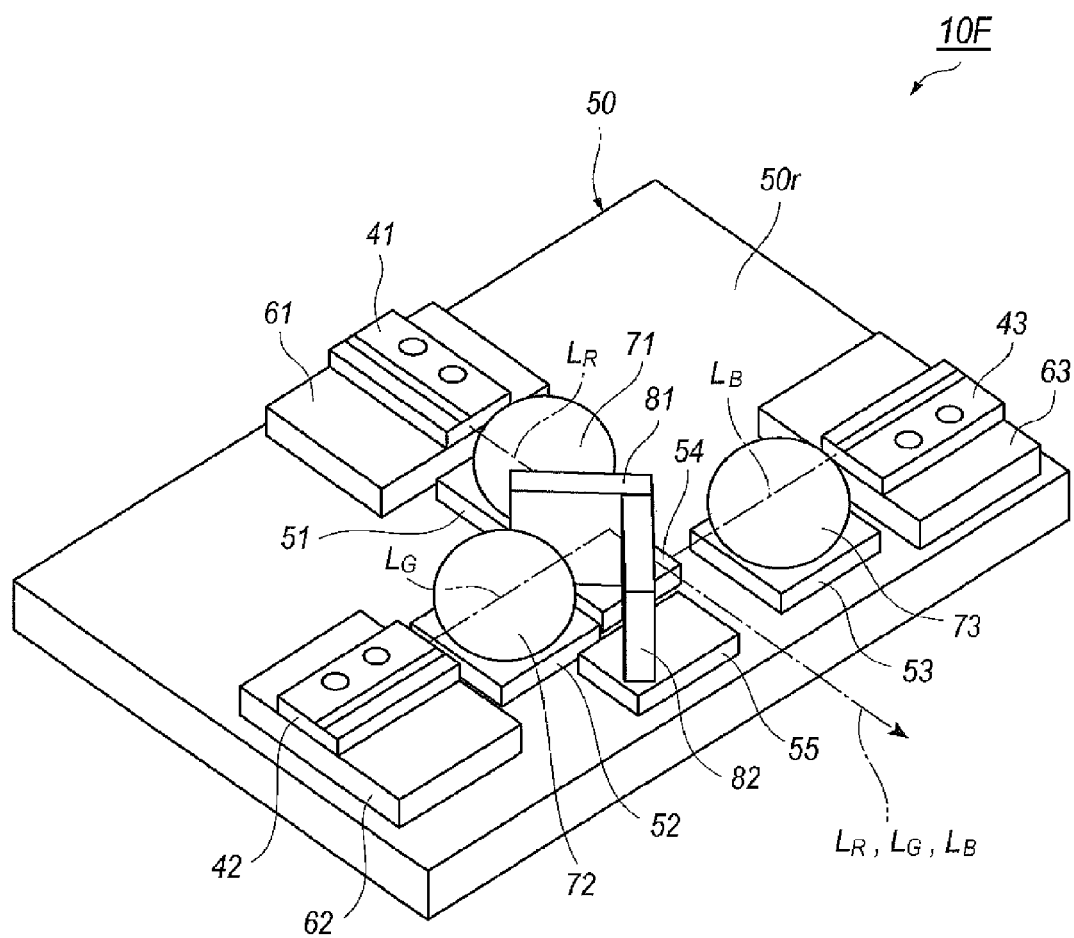
FIG. 16 is a perspective view of an optical assembly according to still another embodiment of the present application.

FIG. 16 is a perspective view of an optical assembly 10F that has features distinguishable from those aforementioned optical assemblies, 10A to 10E, that the green LD 42 is positioned in a side opposite to the position of the blue LD 43 with respect to the axis of the red light $L_R$. The first WSF 81 is set so as to make an angle of 90° with respect to the second WSF 82. Other arrangements except for the green LD 42 and the second lens 72 are same as those of the aforementioned embodiments.

Figure 17:
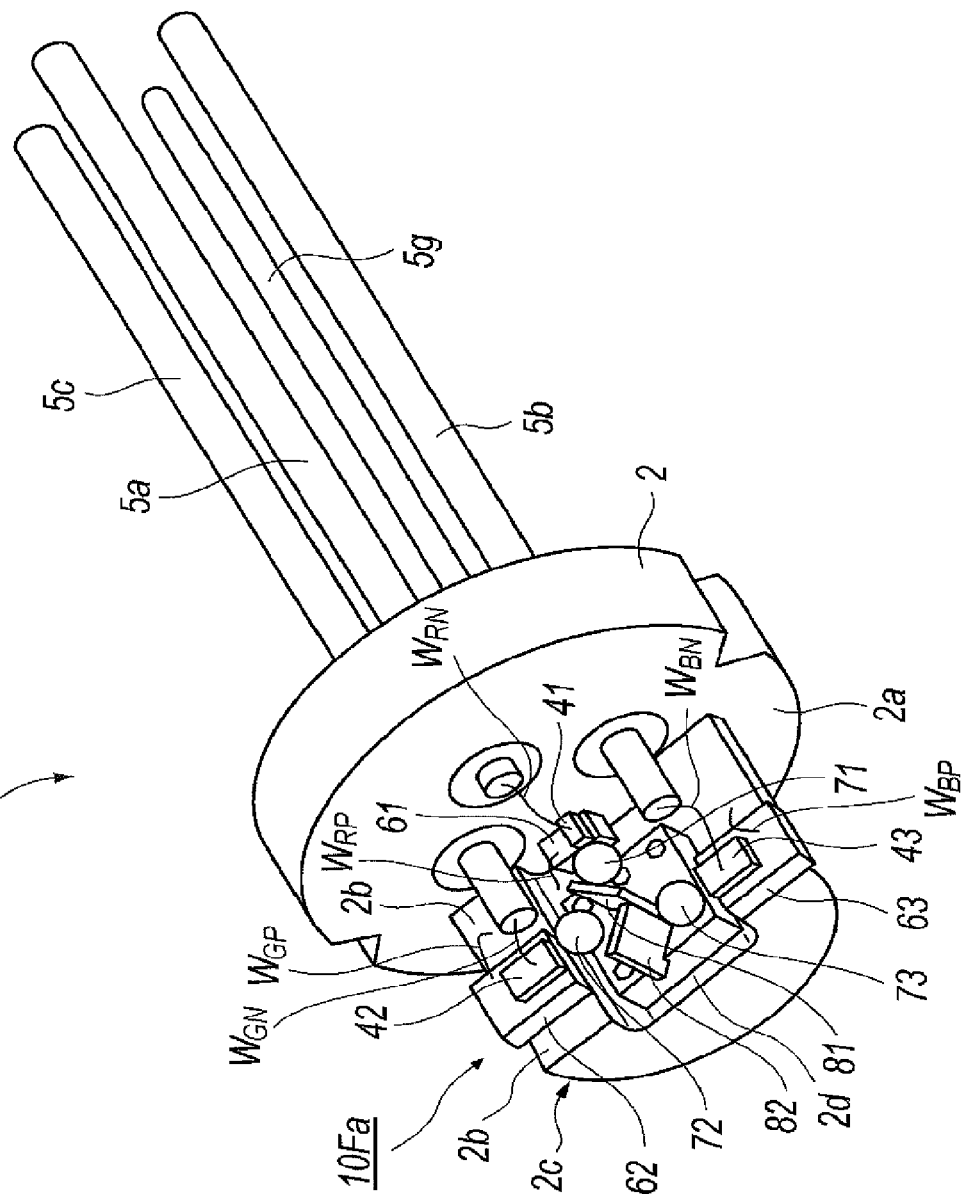
FIG. 17 shows an inside of an optical module installing the optical assembly shown in FIG. 16.

FIG. 17 is a perspective view of an optical module 1C, where a part of which is cut away to show an inside thereof, according to an embodiment of the present application. The optical module 1C installs an optical assembly 10Fa modified from the one 10F shown in FIG. 16. That is, the optical assembly 10Fa includes three LDs, 41 to 43, mounted on respective sub-mounts, 61 to 63, three lenses, 71 to 73, also mounted on sub-bases, which are omitted in FIG. 17, and two WSFs, 81 and 82. A feature of the modified optical assembly 10Fa distinguishable from the optical assembly 10F is that the three LDs, 41 to 43, are not mounted on the base 50 but mounted on the side 2b of the block 2c protruding from the primary surface 2a of the stem 2.

The base 50 of the optical module 10Fa mounts only three lenses, 71 to 73, and two WSFs, 81 and 82, with the arrangement similar to the optical assembly 10F, where two WSFs, 81 and 82, are set thereon so as to make an angle of 90°. Specifically, the base 50 is mounted within a pocket 2d formed in the side 2b of the block 2c. The base 50 of the present embodiment has dimensions of 1 mm×1 mm×0.5 mm, and is made of glass. Because the lenses, 71 to 73, are also made of glass, the reliability of the optical alignment, in particular, the longtime reliability of the alignment condition may be maintained.

The red LD 41 in the top electrode thereof is electrically connected to the lead terminal 5a with a bonding wire $W_{RN}$, while, the back electrode thereof is connected to the stem 2 via the sub-mount 61 and a bonding wire $W_{RP}$. The stem 2 is directly connected to the lead terminal 5g. Electrical connections similar to those of the red LD 41 are provided in the green LD 42 and the blue LD 43. That is, top electrodes of the LDs, 42 and 43, are wire-bonded to respective lead terminals, 5b and 5c, with bonding wires, $W_{GN}$ and $W_{BN}$, respectively; while, the back electrodes of the LDs, 42 and 43, are connected to the stem 2 via the sun-mounts, 62 and 63, and the bonding-wires, $W_{GP}$ and $W_{BP}$.

Figure 18:
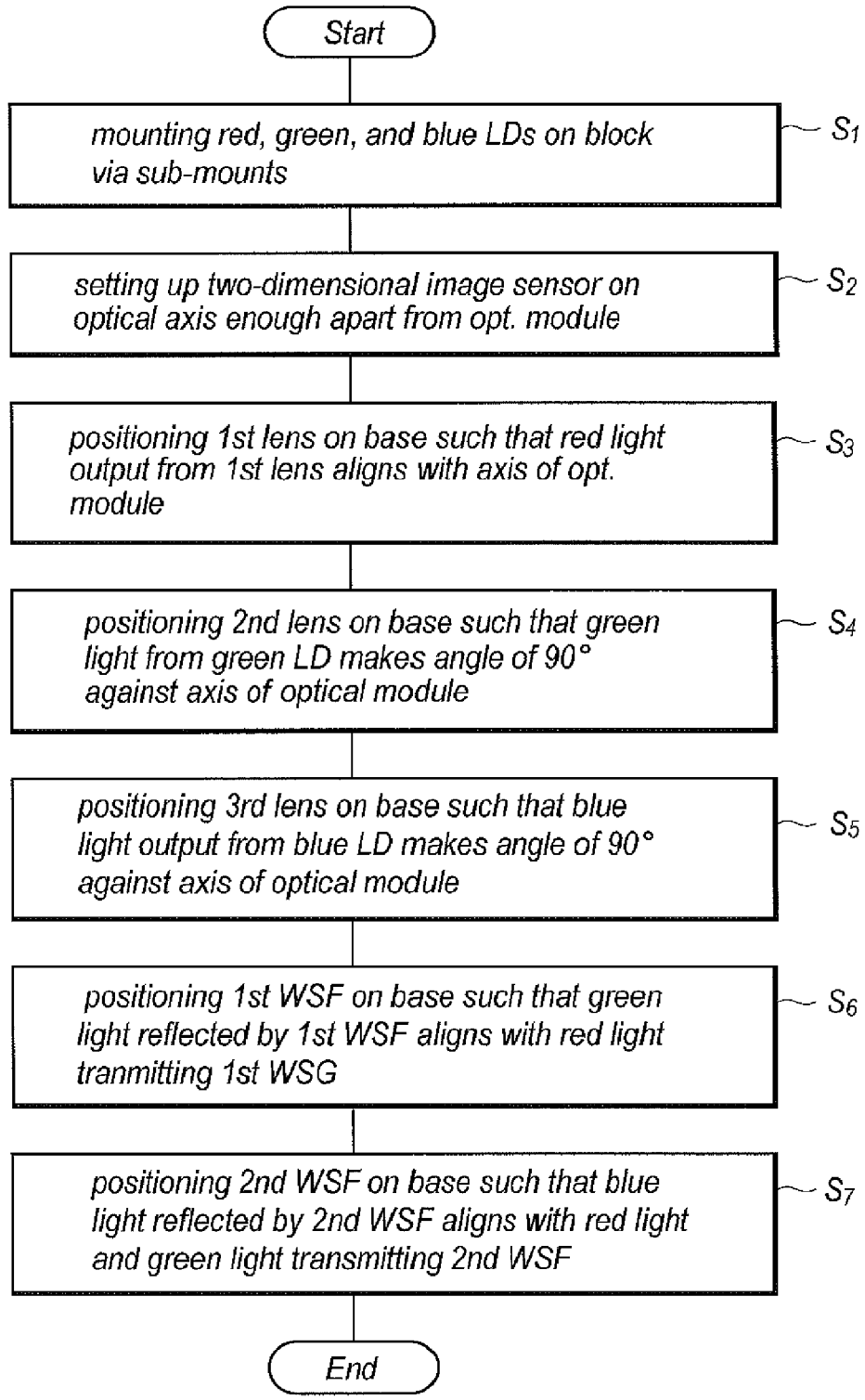
FIG. 18 is a flow chart to assemble the optical assemblies of the embodiments of the present application.
Figure 19:
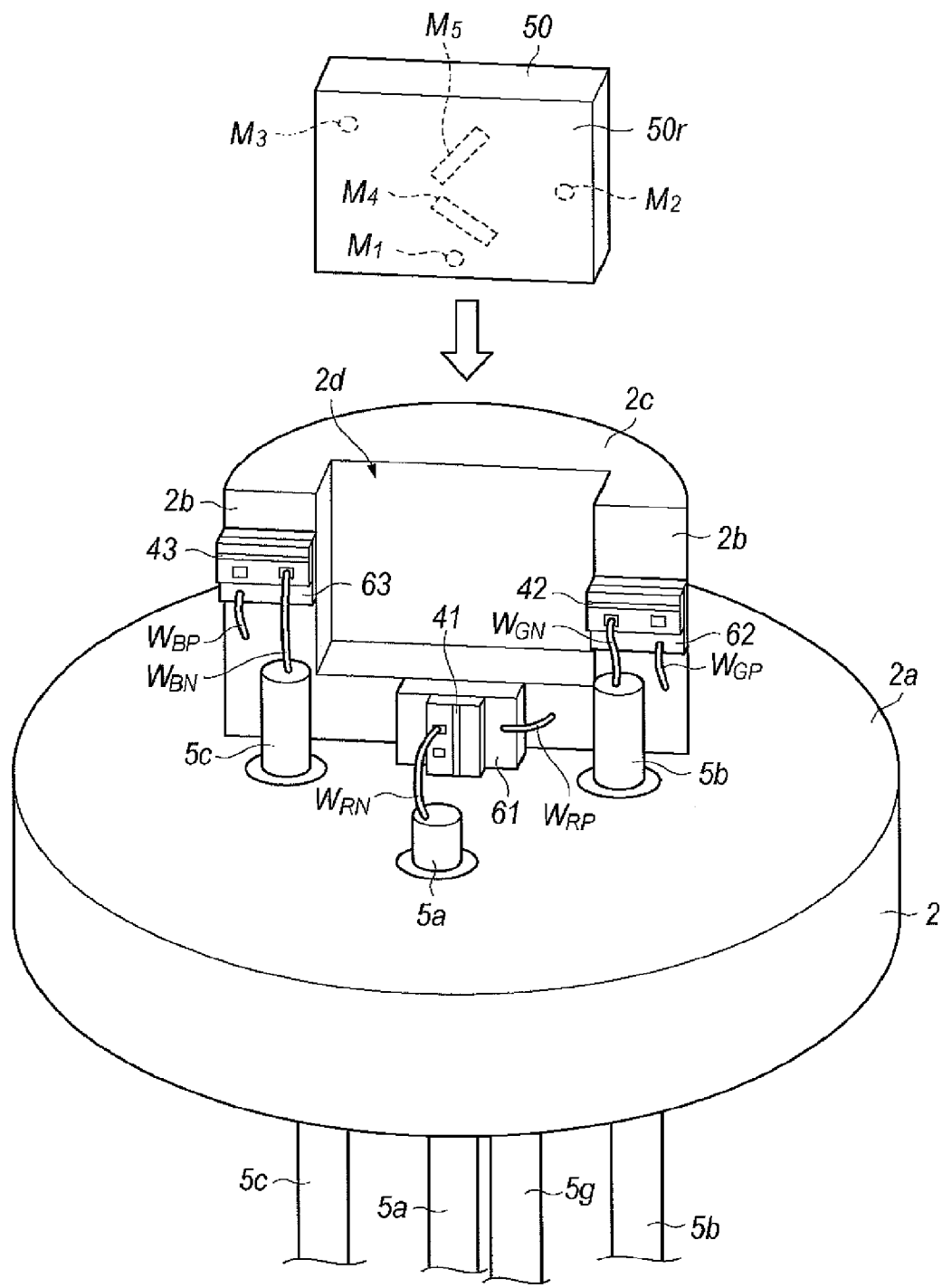
FIG. 19 shows a process to assemble the optical module shown in FIG. 17.

FIG. 18 is a flow chart to assemble the optical module 1C. Referring to FIG. 18, the process first places three LDs, 41 to 43, on the side 2b of the block 2c via respective sub-mounts, 61 to 63, in step $S_1$, as shown in FIG. 19. Then, the base 50 without any optical components is set within the pocket 2d. The base 50 in the top surface thereof 50r provides indicators, $M_1$ to $M_5$, to assist the placement of the optical components, 71 to 82. Indicators, $M_1$ to $M_5$, may be scratched lines and/or hollows into which the optical components are to be set. The sub-mounts, 61 to 63, also provide indicators corresponding to the positions at which the LDs, 41 to 43, to be placed; while, the side 2b of the block 2c provides indicators corresponding to the positions at which the sub-mounts, 61 to 63, are to be placed. The process mounts the LDs, 41 to 43, onto respective sub-mounts, 61 to 63, as referring to indicators on the sub-mounts, 61 to 63; then, mounts the sub-mounts, 61 to 63, accompanied with the LDs, 41 to 43, onto the side 2b of the block 2c as referring to the indicators provided in the side 2b. Thus, the LDs, 41 to 43, are mounted on the side 2b via respective sub-mounts, 61 to 63.

Subsequently, the electrical connections of the LDs, 41 to 43, are carried out. Specifically, the wire-bonding connects the top electrodes of the LDs, 41 to 43, to the tops of respective lead terminals, 5a to 5c, by bonding wires, $W_{RN}$, $W_{GN}$, and $W_{BN}$; and the tops of respective sub-mounts, 61 to 63, to the side 2c by bonding wires, $W_{RP}$, $W_{GP}$, and $W_{BP}$. Although FIG. 19 illustrates the bonding wires, $W_{RN}$, $W_{GN}$, and $W_{BN}$ brought from the top electrodes of the LDs, 41 to 43, are connected to the tops of the lead terminals, 5a to 5c, the bonding wires, $W_{RN}$, $W_{GN}$, and $W_{BN}$, are preferably connected to sides of the lead terminals, 5a to 5c, because the former arrangement is necessary to rotate the optical module 1C by 90° after the first bonding to the top electrodes of the LDs, 41 to 43, is carried out. In an ordinary wire bonding, two planes including the points to be wire-bonded are necessary to be parallel to each other. The wire-bonding to the side of the lead terminals, 5a to 5c, is unnecessary to rotate the optical module 1C during the bonding process.

Step $S_2$ uses a two-dimensional sensor 37 with a sensing surface 32 and a monitor 30. That is, the step $S_2$ sets on the optical axis L the two-dimensional sensor 37 enough apart from the optical module 1C by a distance D to display far-field patterns of the LDs, 41 to 43, on the sensor. The two-dimensional sensor 37 may be a CCD (Charge Coupled Device) camera. The normal of the two-dimensional image sensor 37 is aligned with, or in parallel to the optical axis L. The monitor 30 connected to the sensor 37 provides a screen 31 to display the far-field pattern detected by the sensor 37 two-dimensionally. The screen 31 is aligned such that the center C thereof coincides with the optical axis L of the optical module 1C, and the horizontal line A thereof is parallel to the top surface 50r of the base 50. In the practical assembly, the distance D between the optical module 1C and the sensor 37 is set to be about, or at least one (1) meter.

Step $S_2$ further uses two reflectors, 33 and 34, which may be a prism, a multi-layered mirror, and so on, with reflecting surfaces, 35 and 36. The mirror 33 reflects the green light $L_G$ emitted from the green LD 42 toward the sensor 37 by an angle of 90°; while, the other mirror 34 reflects the blue light $L_B$ coming from the blue LD 43 toward the sensor 37 by an angle of 90°. Thus, the reflecting surface 35 makes an angle of 45° against the optical axis of the green LD 42 also against the axis L of the optical module 1C, and the reflecting surface 36 of the other mirror 34 makes an angle of 45° against the optical axis of the blue LD 43 and also 45° against the axis L of the module 1C.

Figure 21A:
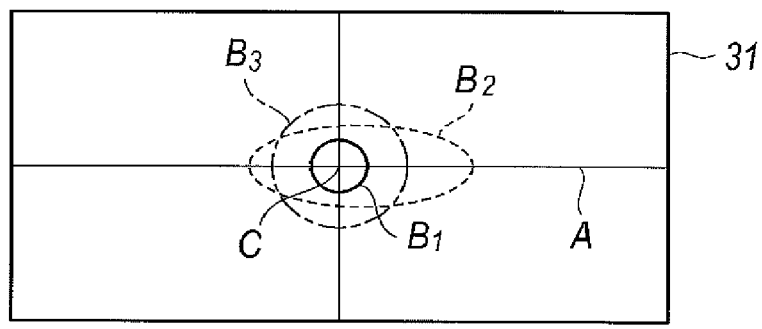
FIGS. 21A to 21C schematically show images projecting on the monitor screen during the alignment of the optical components installed in the optical module shown in FIG. 17.

Step $S_3$ first aligns the lens 71 on the top surface 50r of the base 50 with respect to the red LD 41 such that the red light $L_R$ output from the lens 71 coincides the axis thereof with the axis of the optical module 1C. Specifically, the lens 71 is first placed on the base 50 as referring to the indicator $M_1$. Then, the red LD 41 is practically activated. As monitoring the image, or the far field pattern, projecting on the two-dimensional sensor 37, the lens 71 is optically aligned on the base 50. FIG. 21A schematically illustrates the image appearing on the screen 31 by the red light $L_R$ transmitted through the lens 71. The lens 71 is aligned such that the image on the screen 31 becomes a circular shape like $B_1$ in FIG. 21A and positions in the center C of the screen. After the alignment, the lens 71 is fixed on the base 50 by curing the resin. When the red light $L_R$ passes the lens 71 at positions offset from the center thereof, the image appearing on the screen 31 becomes an ellipsoid like $B_2$ and/or $B_3$, or offset from the center C. Thus, step $S_3$ aligns the red light $L_R$ in the axis thereof coincides with the axis L of the optical module 1C.

Figure 21B:
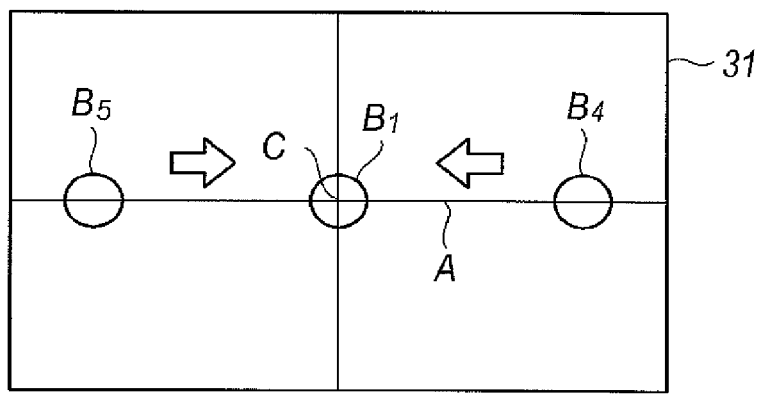

Step $S_4$ aligns the second lens 72 on the base 50 with respect to the green LD 42 such that the green light $L_G$ output from the green LD 42 in the axis thereof makes an angle of 90° with respect to the axis L of the optical module 1C. Specifically, the second lens 72 is first placed in a position on the base 50 indicated by the indicator $M_2$. Then, two LDs, 41 and 42, are practically activated. Monitoring two images by the red and green LDs, 41 and 42, appearing on the screen 31, the lens 72 is adjusted in the position thereof. After an adequate adjustment of the second lens 72, the image by the green LD 42 shows a circular shape like $B_4$ shown in FIG. 21B and positions on the reference line A.

Step $S_5$ aligns the third lens 73 on the base 50 with respect to the blue LD 43 such that the blue light $L_B$ output from the blue LD 43 in the axis thereof makes an angle of 90° with respect to the axis L. Specifically, the third lens 73 is first placed in a position on the base 50 indicated by the indicator $M_3$. Then, three LDs, 41 to 43, are practically activated. Monitoring three images by the red, green, and blue LDs, 41 to 43, appearing on the screen 31, the lens 73 is adjusted in the position thereof. After an adequate adjustment of the third lens 73, the image by the blue LD 43 shows a circular shape like $B_5$ shown in FIG. 21B and positions on the reference line A but in the side opposite to the image $B_4$ with respect to the image $B_1$. Thus, the screen 31 shown in FIG. 21B after step $S_5$ indicates three images, $B_1$, $B_4$, and $B_5$, each having a circular pattern and locating on the horizontal line A.

Figure 22:
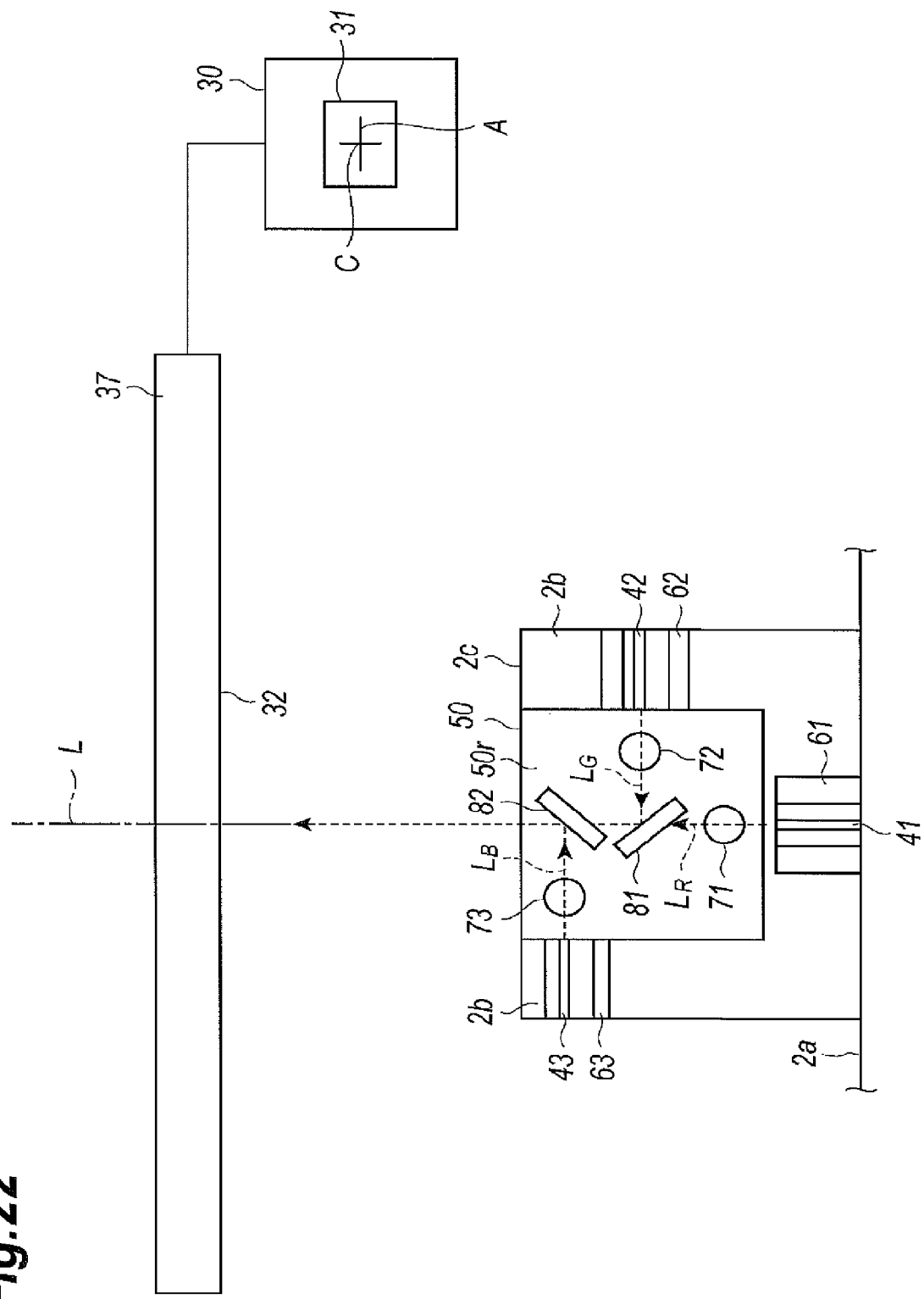
FIG. 22 schematically shows a process after the process shown in FIG. 20 to assembly the optical module shown in FIG. 17.

Step $S_6$ aligns the first WSF 81 by the setup shown in FIG. 22 such that the green light $L_G$ reflected by the first WSF 81 is aligned with the axis L of the optical module 1C. Although FIG. 22 explicitly illustrates the second WSF 82 on the base 50; the second WSF 82 is not set on the base at step $S_6$. Specifically, the first WSF 81 is first set on the base 50 in the position indicated by the indicator $M_4$. Then, the red LD 41 and the green LD 42 are practically activated. Monitoring the images appearing in the screen 31, the WSF 81 is adjusted in the rotation angle and the elevation/depression angle thereof such that the image $B_4$ overlaps with the image $B_1$ at the center C.

Figure 21C:
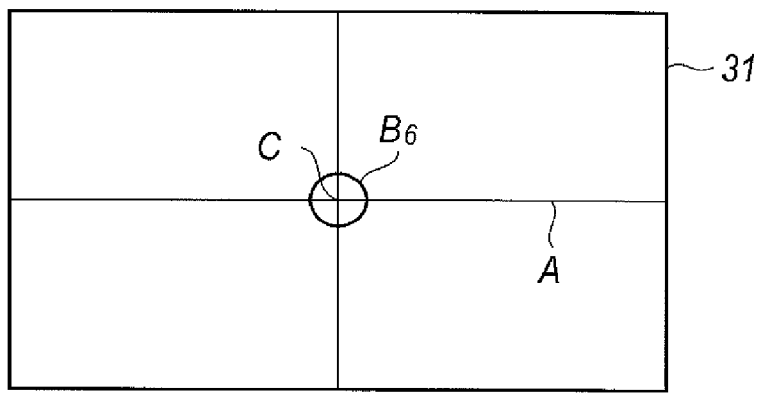

Step $S_7$ aligns the second WSF 82 by the setup shown in FIG. 22 such that the blue light $L_B$ reflected by the second WSF 82 is aligned with the axis L of the optical module 1C. Specifically, the second WSF 82 is first set on the base 50 in the position indicated by the indicator $M_5$. Then, the red LD 41, green LD 42, and the blue LD 43 are practically activated. Monitoring the images appearing in the screen 31, the WSF 82 is adjusted in the rotation angle and the elevation/depression angle thereof such that the image $B_5$ overlaps with the images, $B_1$ and $B_4$, at the center C and becomes the image like $B_6$ shown in FIG. 21C. Thus, the optical alignment of the components mounted on the base 50 is completed.

The optical module 1C, where three LDs, 41 to 43, three lenses, 71 to 73, and two WSFs, 81 and 82, are thus aligned, may output the multiplexed light containing the red, green, and blue light, $L_R$, $L_G$, and $L_B$, on the optical axis L. Because the lenses, 71 to 73, operate as a collimating lens, the multiplexed light output from the module 1C is the collimated beam.

In steps $S_6$ and $S_7$, the red light $L_R$ passes the WSFs, 81 and 82, which slightly shifts the image $B_1$ horizontally along the line A. However, the two-dimensional sensor 37 is placed at least one (1) meter apart from the optical module 1C, the shift of the image $B_1$ appearing on the screen 31 may be far smaller than the deviation of the images, $B_4$ and $B_5$, by the rotation/elevation/depression of the WSFs, and the shift of the image $B_1$ may be ignored.

Figure 23:
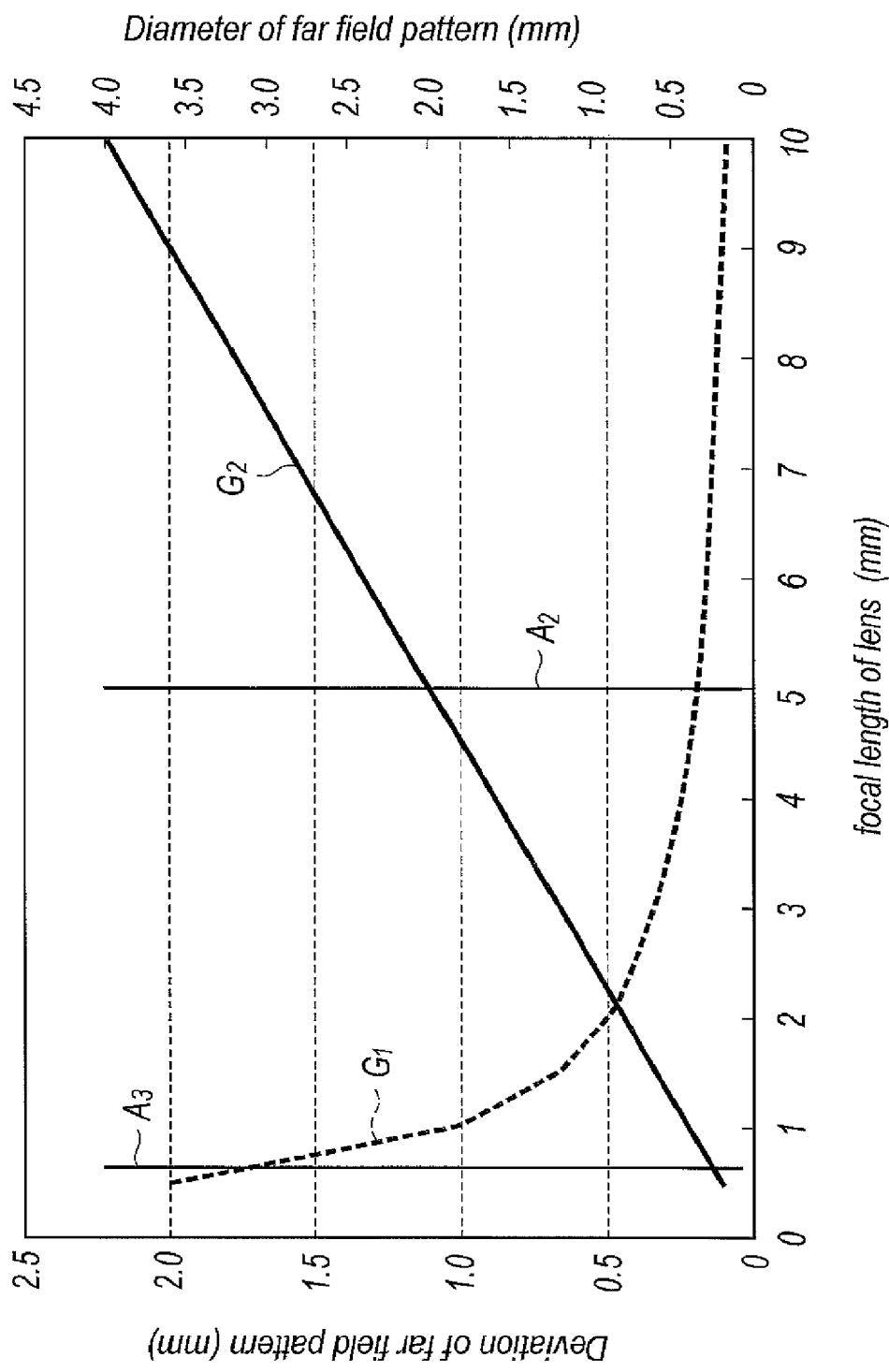
FIG. 23 simulates the deviation and diameter of a projecting image against the focal length of the lens.

FIG. 23 shows calculations of shifts of the point, $P_R$ to $P_B$, against the focal length of the lens, 71 to 73, when the lens deviates the position thereof from the designed one. The calculation assumes that the two dimensional sensor 37 is set apart from the lenses, 71 to 73, by one (1) meter and the lenses, 71 to 73, deviates by 1 µm from the designed position. The horizontal axis corresponds to the focal length of the lenses, 71 to 73; while, the vertical axis shows the shift and the diameter of the images, $P_R$ to $P_B$, where the deviation of the image is denoted by the behavior $G_1$, while, the diameter of the image is denoted by the behavior $G_2$. Conventional optical modules for the application of, for instance, an optical pickup and a compact projector, set the focal length of the lens to be about 5 mm, which is dented by the line $A_2$. On the other hand, the present embodiment installs the lenses, 71 to 73, placed immediate close to the LDs, 41 to 43, which results in the focal length of the lenses, 71 to 73, shorter than 1 mm, typically around 0.5 mm.

According to the calculation of FIG. 23, the deviation of the image, $P_R$ to $P_B$, reaches a few milli-meters, typically exceeding 1.5 mm but less than 2.0 mm, even the displacement of the lenses, 71 to 73, is merely 1 µm. Thus, the optical modules, 1A to 1C, inevitably requests for the lenses, 71 to 73, to be aligned in extremely precise. The method to assemble the optical modules, 1A to 1C, enables the alignment of the lenses, 71 to 73, so precisely by placing the two-dimensional sensor 37 enough apart from the optical module 1C.

Figure 24:
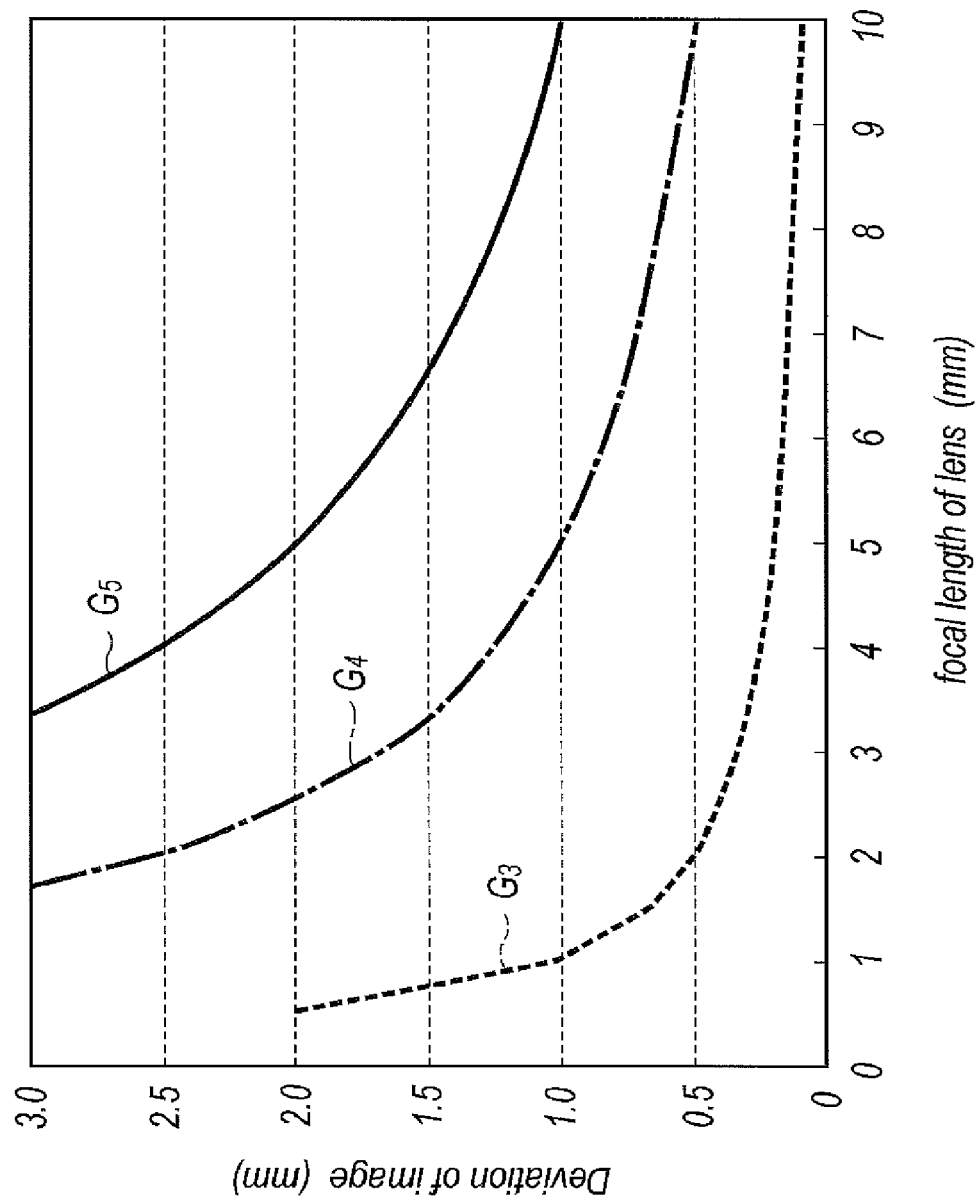
FIG. 24 simulates the deviation of a projecting image when the lens to collimate the light deviates from the designed position by 1, 5, and 10 µm.

FIG. 24 confirms, by the calculation, the deviation of the image, $P_R$ to $P_B$, when the lenses, 71 to 73, deviate from the designed position depending on the focal length of the lenses, 71 to 73. The calculation assumes that the two-dimensional sensor 37 is set apart from the lenses, 71 to 73, by one (1) meter. Behaviors $G_3$ to $G_5$ correspond to cases when the lens displaces from the designed center by 1 µm, 5 µm, and 10 µm, respectively. From the calculations shown in FIG. 24, when the lenses, 71 to 73, have the focal length thereof shorter than 1 mm, the deviation of the image, $P_R$ to $P_B$, from the designed one barely results in a practical range of about a few millimeter. When the focal length of the lens is 5 µm and/or 10 µm, the deviation of the image from the designed one becomes extreme, which is unacceptable in the practical use. From the calculations of FIG. 24, the optical alignment by setting the two-dimensional sensor apart from the lens at least by 1 meter becomes useful.

The optical module 1C may emit the multiplexed light whose near-field pattern may be regarded as a circular pattern, that is, the optical module 1C may be regarded as a point light source. Because the lenses, 71 to 73, collimate the red, green, and blue light into substantially parallel beams; the lens 4 may concentrate the multiplexed light onto the focal point thereof as long as the lens 4, which is held by the cap 3 in the embodiments, 1A to 1C, of the application, is set on the optical axis of the module, which facilitates the multiplexed light to be entered into an optical fiber coupled with the optical module, 1A to 1C. Moreover, when the cap 3, or the optical modules, 1A to 1C, have no lens 4, the multiplexed light output from the optical module, 1A to 1C, may be utilized as a parallel beam.

In the present optical module 1C, the base 50 may be made of glass provided with indicators, $M_1$ to $M_5$, for the positions of the optical components. Because the base 50 is made of glass, the lenses, 71 to 73, may be also made of glass, and the sub-bases, 51 to 53, may be also made of glass, the thermal characteristics, typically the thermal expansion coefficient thereof become similar to each other, which enhances the long-term reliability of the module.

The method to assemble the optical assembly, 10F and/or 10Fa, of the present embodiment, in particular, in the process to assemble the blue LD 43 and the third lens 73 on the base 50, the projecting image $P_B$ of the blue light $L_B$ is positioned so as to put the projecting point $P_R$ of the red light $L_R$ between the image $P_B$ and the $P_G$ of the green light $L_G$, which facilitates the alignment of the blue LD 43 and the third lens 73. Moreover, the arrangement of the optical assembly, 10F and/or 10Fa, puts the red LD 41 between the green LD 42 and the blue LD 43, which means that the multiplexed light may be emitted from a position close to a center of the base 50.

Figure 20:
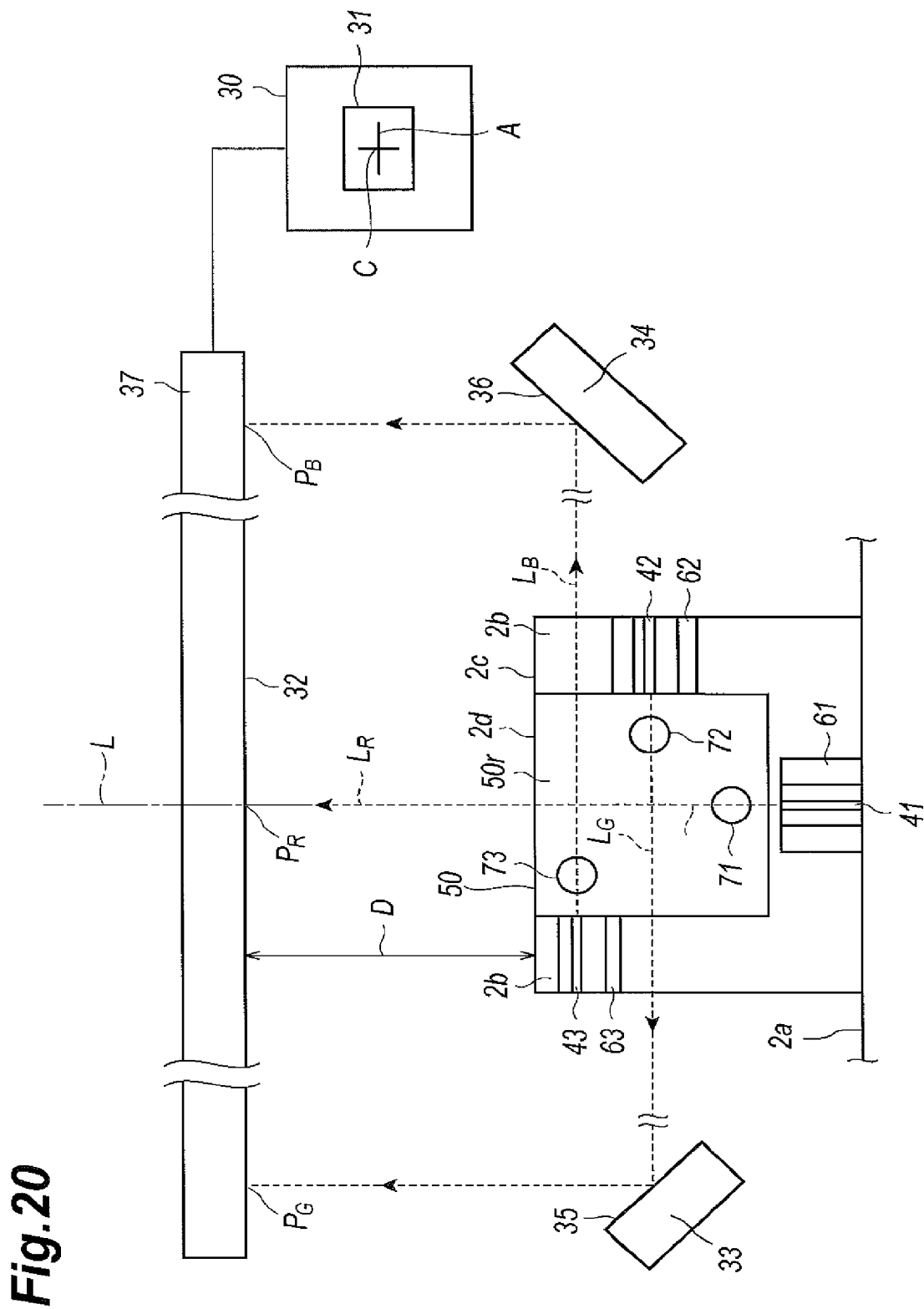
FIG. 20 schematically shows a process after the process shown in FIG. 19 to assemble the optical module shown in FIG. 17.

Referring to FIG. 20, the mirror 34 to align the blue LD 43 and the third lens 73 is set in a position opposite to the position with respect to the optical axis of the red light $L_R$ where the mirror 33 is set for aligning the green LD 42 and the second lens 72. Accordingly, the mirror 34 is necessary to be set in two ways, one of which makes an angle of +45° to the optical axis of the red light $L_R$, while, the other makes an angle of −45° with respect to the optical axis of the red light $L_R$. Also, the processes to assemble two WSFs, 81 and 82, are necessary to prepare two types of the vacuum collet to hold respective WSFs, 81 and 82, because the WSFs, 81 and 82, make angles of ±45° with respect to the axis L. Aforementioned embodiments of the optical assemblies, 10A to 10E, where the green LD 42 and the blue LD 43 are placed in the same side, may simplify the process, because the process is necessary to prepare merely one type of the mirror 90 for aligning the green and blue LDs, 41 and 42, and the second and third lenses, 72 and 73, and one type of the collet for holding the WSFs, 81 and 82.

Sixth Embodiment

Figure 25:
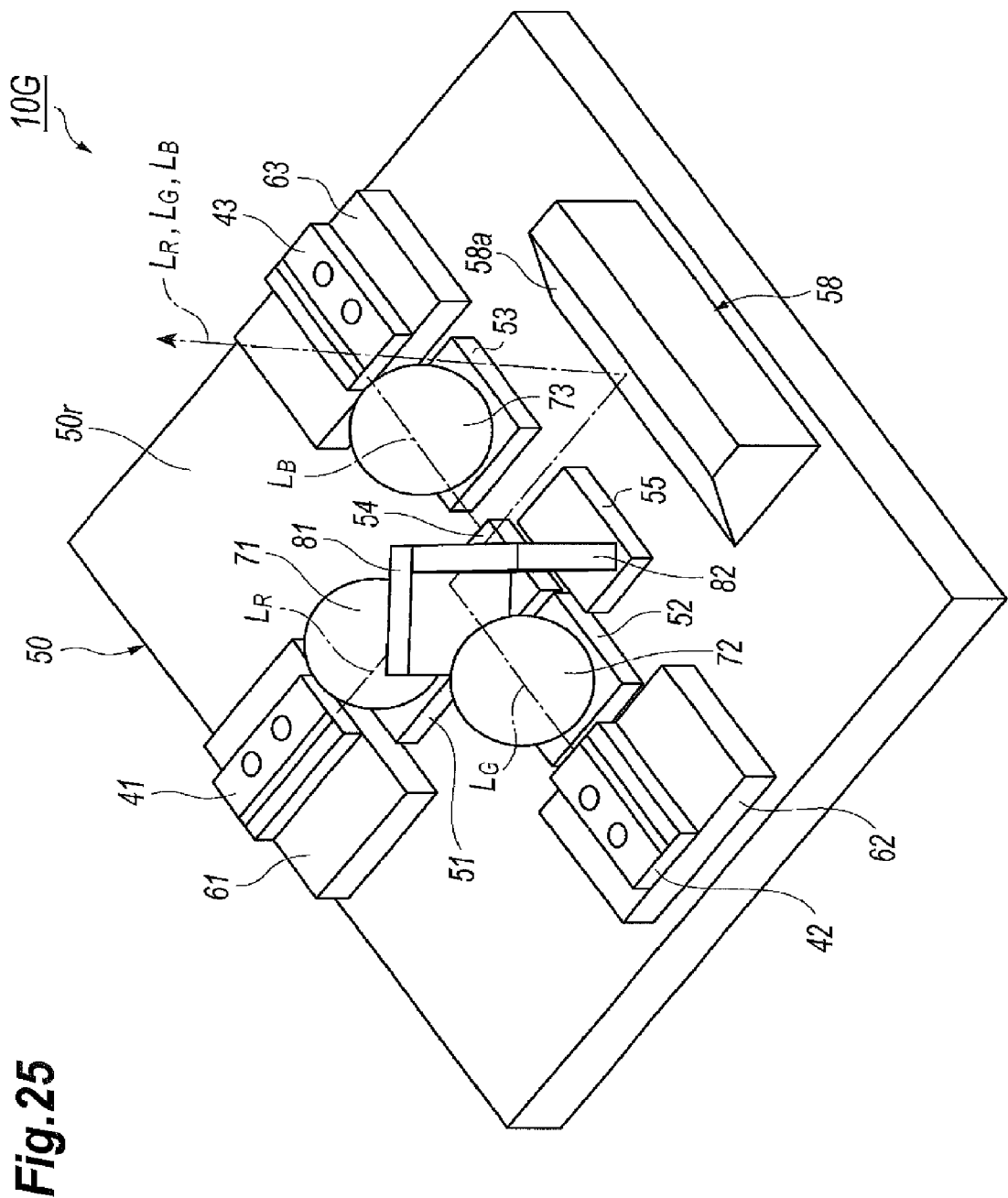
FIG. 25 is a perspective view showing an optical assembly according to still another embodiment.

FIG. 25 is a perspective view showing another optical assembly 10G according to an embodiment of the present application. The optical assembly 10G provides, in addition to the arrangement of the last embodiment 10F shown in FIGS. 18 to 22, a mirror 58 to reflect the multiplexed light. Other arrangements of the optical assembly 10G are substantially same as those of the aforementioned optical assembly 10F.

The mirror 58 is mounted on the top surface 50r of the base 50 and provides an inclined surface 58a same as the optical assemblies, 10C and 10D, shown in FIGS. 12 and 13. The inclined surface 58a reflects the multiplexed light toward the direction normal to the top surface 50r. One example of the inclined surface 58a makes an angle of 45° with respect to the top surface 50r.

The optical assembly 10G, similar to those of the aforementioned assemblies, 10C and 10D, the LDs, 41 to 43, and the lenses, 71 to 73, may be precisely aligned to each other so as to align the optical axes of the laser light, $L_R$, $L_G$, and $L_B$, substantially aligned with each other without expanding the size of the assembly.

Seventh Embodiment

Figure 26:
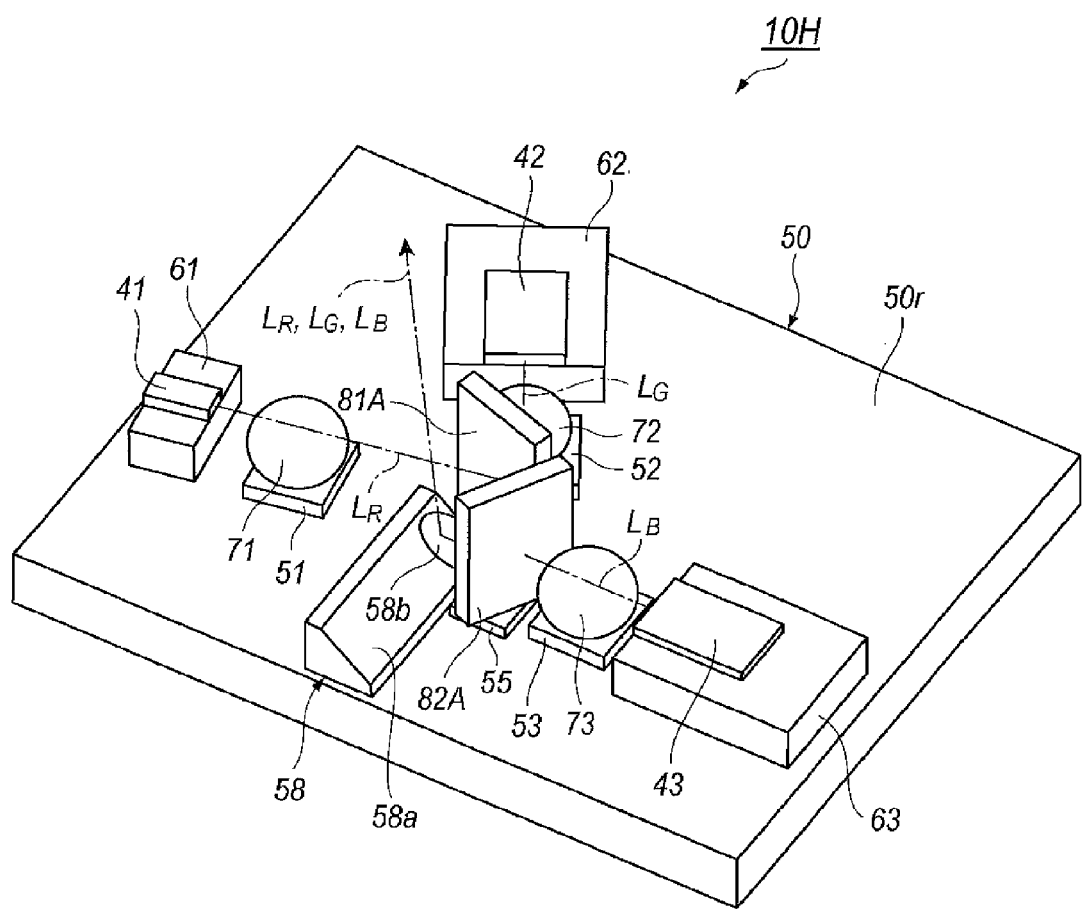
FIG. 26 is a perspective view showing an optical assembly modified from the optical assembly shown in FIG. 25.

FIG. 26 shows another optical assembly 10H whose arrangements for the optical components are slightly modified from the arrangements of the optical assembly 10G. That is, the optical assembly 10H provides, instead of two WSFs, 81 and 82, appearing in the all of the aforementioned optical assemblies, 10A to 10G, modified WSFS, 81A and 82A. A feature of the optical assembly 10H is that three LDs, 41 to 43, are mounted on the base 50 but the optical axes thereof are not perpendicular to each other. Also, the optical assembly 10H provides a mirror 58 to bend the axis of the multiplexed light by 90°.

The first WSF 81A, which is a type of the multi-layered films each stacked on a glass substrate, is mounted on the base 50 via the sub-base 54. One surface of the first WSF 81A optically couples with the first lens 71, while, the other surface optically couples with the second lens 72. The first WSF 81A reflects the red light $L_R$ emitted from the red LD 41 and collimated by the first lens 71; while, transmits the green light $L_G$ emitted from the green LD 42 and collimated by the second lens 72. The optical axis of the red light $L_R$ reflected by the first WSF 81A is aligned with that of the green light $L_G$ transmitted through the first WSF 81A. The relation between the reflection and the transmission of the light, $L_R$ and $L_G$, is opposite to that of the aforementioned embodiments, 10A to 10G. That is, the aforementioned embodiments, 10A to 10G, transmits the red light $L_R$ but reflects the green light $L_G$ at the first WSF 81. One of features of the optical arrangement of the first WSF 81A and two LDs, 41 and 42, of the present embodiment is that two LDs, 41 and 42, in the optical axes thereof makes an angle less than 90° and the first WSF 81A in the normal of the reflecting surface thereof makes an angle less the 45° with respect to the optical axis of the red LD 41.

The second WSF 82A also has the type of the multi-layered films and is mounted on the base 50 via the sub-base 55. Similar to the aforementioned embodiments, 10A to 10G, one of surfaces of the second WSF 82A optically couples with the first WSF 81A to reflect the red light $L_R$ and the green light $L_G$ multiplexed by the first WSF 81A; while, the other surface optically couples with the blue LD 43. The second WSF 82A reflects the multiplexed light, transmits the blue light $L_B$, and outputs the multiplexed light containing the red light $L_R$, the green light $L_G$, and the blue light $L_B$, toward the reflector 58, which is also an arrangement opposite to the aforementioned embodiments, 10A to 10G, where the second WSF 82 reflects the blue light $L_B$ but transmits the multiplexed light of the red $L_R$ and the green light $L_B$. The blue light $L_B$ transmitted through the second WSF 82A aligns the optical axis thereof with the optical axis of the multiplexed light of the red and green light, $L_R$ and $L_G$. The second WSF 82A is set on the base such that the normal of the reflecting surface thereof makes an angle less than 45° with respect to the optical axis of the multiplexed light coming from the first WSF 81A. Such arrangements of the first and second WSFs, 81A and 82A, enable LDs, 41 to 43, and two WSFs, 81A and 82A, to be mounted on the base 50 in compact.

The reflector 58 is mounted on the optical axis of the multiplexed light of the red $L_R$, green $L_G$, and blue beams $L_B$. Similar to that provided in the aforementioned embodiments, 10C, 10D, and 10G, the reflector 58 provides an inclined surface 58a to reflect the multiplexed light. In an example, the inclined surface 58a makes an angle of 45° against the top surface 50r of the base 50; that is, the inclined surface 58a reflects incoming light toward a direction normal to the top surface 50r. The reflector 58 of the present embodiment has a feature distinguishable from those in the aforementioned assemblies, 10C, 10D, and 10G, that the inclined surface 58a may reflect the incoming light only by a restricted area 58b. Setting the restricted area 58b narrower than the field pattern of the multiplexed light of the red $L_R$, green $L_G$, and blue light $L_B$, and the shape thereof so as to generate a circular field pattern, the light reflected by the restricted area may have the circular pattern.

An LD emitting visible light generally has a configuration of, what is called, the ridge waveguide structure. Such an LD emits visible light with an ellipsoidal field pattern with the major axis thereof parallel to the stacked semiconductor layers that extend in parallel to the reference surface 50r, and this ellipsoidal field pattern is maintained even the light passes the lenses, 71 to 73. The restricted area 58b with an ellipsoidal plane shape on the inclined surface 58a, that is, the minor axis of the restricted area 58b extends in parallel to the top surface 50r of the base 50, may convert the ellipsoidal field pattern into a circular pattern. Thus, the multiplexed light of the red $L_R$, the green $L_G$, and the blue $L_B$ having the ellipsoidal field pattern elongated in parallel to the top surface 50r of the base 50 may be output from the optical assembly 10H as the multiplexed light having the circular field pattern.

The optical assembly 10H of the present embodiment provides three visible LDs, 41 to 43, and three lenses, 71 to 73, to collimate the visible light; and the LDs, 41 to 43, and the lenses, 71 to 73 are mounted on the top surface 50r of the base 50 via the sub-bases, 51 to 53. Thus, even the sub-bases, 51 to 53, are applied with an excess resin to fix the lenses, 71 to 73, a surplus resin is prevented from oozing out to the neighbor sub-bases, 71 to 73.

Eighth Embodiment

Figure 27:
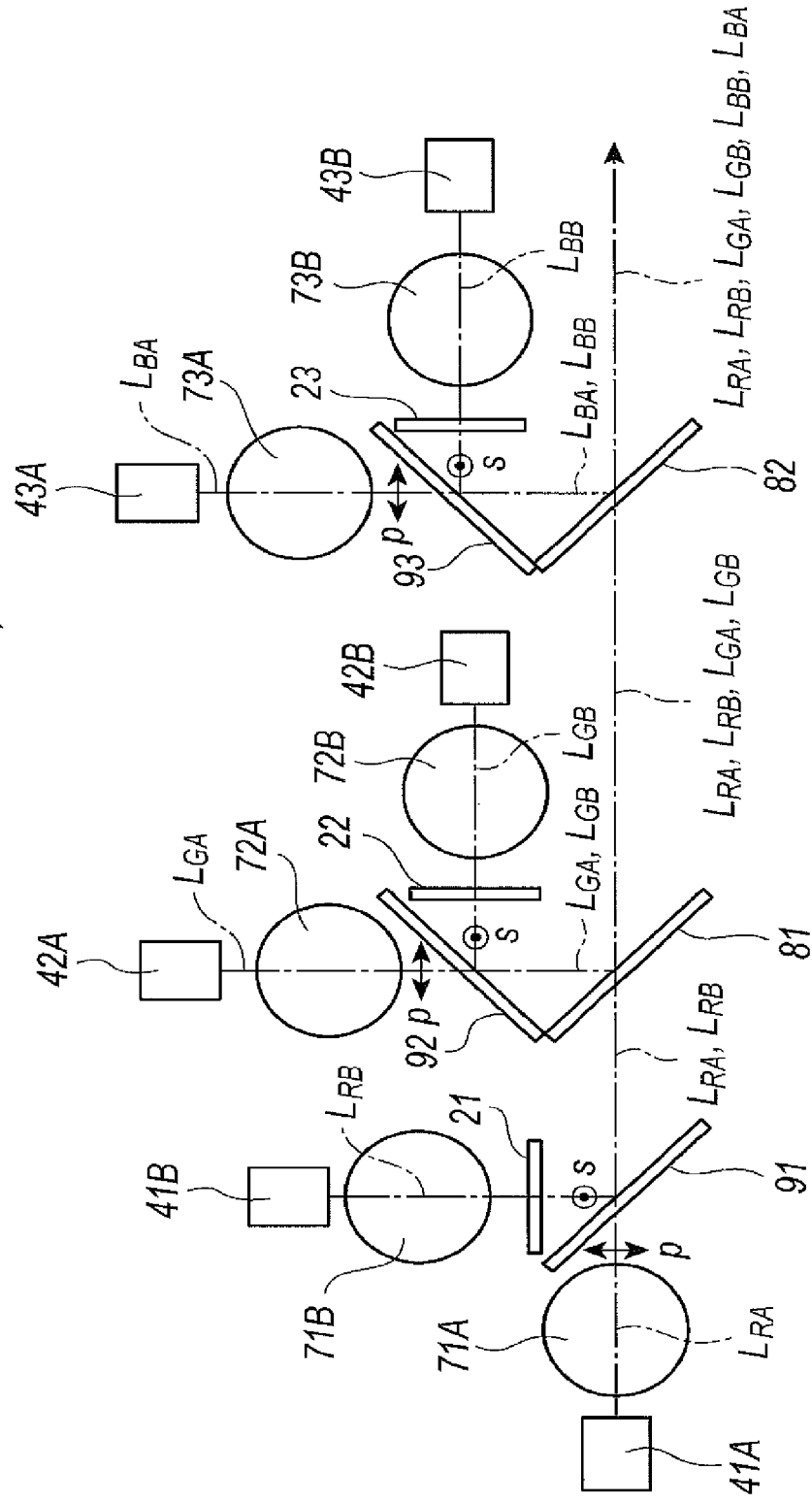
FIG. 27 schematically illustrates an optical arrangement of an optical assembly according to an embodiment of the present application.

FIG. 27 schematically illustrates a plan view of an optical assembly 10J according to the eighth embodiment of the application, where FIG. 27 omits the base 50, the sub-mounts, 61 to 63, and the sub-bases, 51 to 55.

The optical assembly 10J further provides additional three LDs, 41B, 42B, and 43B; three lenses, 71B, 72B, and 73B; three half wave retarders, 21 to 23; and three polarization combiners, 91 to 93. Three LDs, 41A, 42A, and 43A, three lenses, 71A, 72A, and 73A, and two WSFs, 81 and 82 are provided in the aforementioned embodiments, 10A to 10H.

The red LD 41B, which is the fourth LD, emits light $L_{RB}$ with a wavelength in a red region, for instance, the wavelength of 640 nm substantially same as that of the first LD 41A. The red LD 41B is mounted on the base 50 via the sub-mount 61B, not shown in FIG. 27, independent of the sub-mount 61A that mounts the first LD 41A. The optical axis of the red light $L_{RB}$ is perpendicular to the first red light $L_{RA}$ emitted from the first red LD 41A.

The additional green LD 42B, which is the fifth LD, emits light with a wavelength in the green region, namely, 535 nm substantially same as that of the second green LD 42A in the present embodiment. The second green LD 42B is mounted on the base 50 via the sub-mount 62B independent of the sub-mount 62A for the first green LD 42A. The optical axis of the green light $L_{GB}$ for the second green LD 42B is perpendicular to the optical axis of the first green LD 42A.

The second blue LD 43B, which is the sixth LD, emits light $L_{BB}$ with a wavelength in the blue region, namely 430 nm, which is substantially same as that of the third LD 43A in the present embodiment. The second blue LD 43A is also mounted on the base 50 via the sub-mount 63B independent of the third sub-mount 63A for the first blue LD 43A. The optical axis of the second blue LD 43B is perpendicular to the optical axis of the first blue light $L_{BA}$ of the first blue LD 43A.

The additional lenses, 71B, 72B, and 73B, optically couple with respective additions LDs, 41B, 42B, and 43B to collimate light, $L_{RB}$, $L_{GB}$, and $L_{BB}$, emitted from respective LDs, 41B, 42B, and 43B. The additional lenses, 71B, 72B, and 73B, are also mounted on the base 50 via respective sub-bases, 51B, 52B, and 53B, independent to each other and to the sub-bases, 51A, 52A, 53A, 54, and 55.

The half wave retarders, 21 to 23, each optically couples with the additional LDs, 41B, 42B, and 43B. The half wave retarders, 21 to 23, rotate the polarization of the light, $L_{RB}$, $L_{GB}$, and $L_{BB}$ coming from the LDs, 41B, 42B, and 43B, by π/2 (90°). Accordingly, the red light $L_{RB}$, the green light $L_{GB}$, and the blue light $L_{BB}$ output from respective half wave retarders, 21 to 23, have the polarization direction perpendicular to the polarization direction of the red light $L_{RA}$, the green light $L_{GA}$, and the blue light $L_{BA}$, respectively.

The polarization combiners, 91 to 93, have a characteristic that relatively greater reflectance but relatively smaller transmittance, for instance, for light with the p-polarization; while, relatively smaller reflectance but relatively greater transmittance for the light with the s-polarization. Accordingly, in the optical arrangement of the optical assembly 10J, the first polarization combiner 91 has the relatively greater transmittance (but smaller reflectance) for the red light $L_{RA}$ with the p-polarization but relatively greater reflectance (but smaller transmittance) for the red light $L_{RB}$ with the s-polarization. In FIG. 27, the s-polarization is denoted by a dot, while, the p-polarization is denoted by an arrow. Similar conditions appear in the second and third polarization combiners, 92 and 93, for the green light, $L_{GA}$ and $L_{GB}$, and the blue light $L_{BA}$ and $L_{BB}$. Thus, the polarization combiners, 91 to 93, output the combined light, $L_{RA}+L_{RB}$, $L_{GA}+L_{GB}$, and $L_{BA}+L_{BB}$.

The first WSF 81 multiplexes the red light with the green light. In the present embodiment, the red light contains two components, $L_{RA}$ and $L_{RB}$, where the polarization directions are perpendicular to each other. Similarly, the green light coming from the second polarization combiner 92 contains two components, $L_{GA}$ and $L_{GB}$, also having respective polarizations perpendicular to each other. The first WSF 81 is preferable to have the polarization independent transmittance and the polarization independent reflectance. The first WSF 81 outputs the multiplexed light containing components of $L_{RA}$, $L_{RB}$, $L_{GA}$, and $L_{GB}$.

The second WSF 82 multiplexes the blue light coming from the third polarization combiner 93 with the light output from the first WSF 81. Similar to the first WSF 81, the second WSF 82 preferably has the polarization independent transmittance and the polarization independent reflectance. The second WSF 82 outputs the multiplexed light having all components of $L_{RA}$, $L_{RB}$, $L_{GA}$, $L_{GB}$, $L_{BA}$, and $L_{BB}$.

Green LDs and blue LDs currently available in the market have the structure of, what is called, the edge-emitting type. When all LDs provided in the optical assembly 10J have the structure of the edge emitting type and the stacking direction of the semiconductor layers within the LDs is perpendicular to the top surface 50r of the base 50, that is, the extension direction of the semiconductor layers is parallel to the top surface 50r, the polarization directions of the light emitted therefrom are involved within a virtual plane parallel to the top surface 50r. Rotating the polarization direction of the LDs, 41B, 42B, and 43B, by π/2 (90°) by the half wave retarders, 21 to 23, and combining two light, $L_{RA}$ and $L_{RB}$, $L_{GA}$ and $L_{GB}$, $L_{BA}$ and $L_{BB}$, by the polarization combiners, 91 to 93, the light thus combined has intensity as twice as that for single LDs, 41A, 42A, and 43A. Accordingly, the multiplexed light finally output from the second WSF 82 containing components of $L_{RA}$, $L_{RB}$, $L_{GA}$, $L_{GB}$, $L_{BA}$, and $L_{BB}$ also shows the intensity as twice as that of the aforementioned optical assemblies, 10A to 10H. Thus, the optical assembly 10J of the present embodiment may be used in an application where greater intensity is requested such as an over-head projector and so on.

Moreover, similar to those of the aforementioned optical assemblies, 10A to 10H, the present optical assembly 10J mounts the lenses, 71A to 73B, on the base 50 via respective sub-bases, 51A to 53B, independent of each other. Such arrangements of these lenses, 71A to 73B, effectively prevent an excess resin applied to the top of the sub-bases, 51A to 53B, to fix the lenses, 71A to 73B, thereto from oozing out to the neighbor sub-bases, 51A to 53B.

Although the optical assembly 10J inevitably requires the half wave retarders, 21 to 23, a half wave retarders generally has compact dimensions. In spite of the increased number of optical components, the size of the base, 50, 150, and 250 of the optical assemblies, 10A to 10J, or the package installing the optical assemblies, 10A to 10J, therein is suppressed far smaller compared with a case where the LDs, 41A to 43B, are independently packaged.

[First Modification]

Figure 28:
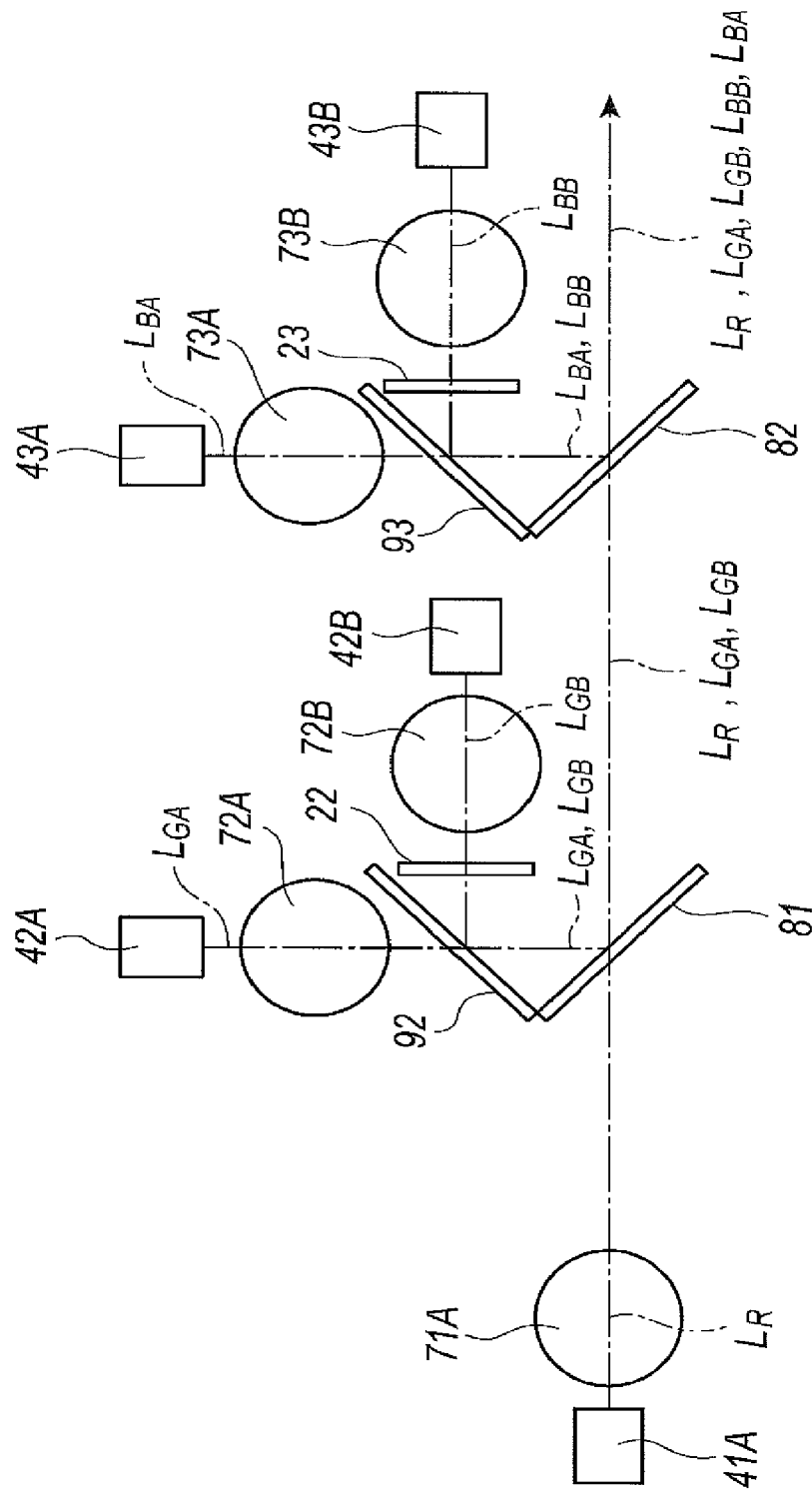
FIG. 28 schematically illustrates an optical arrangement of an optical assembly modified from the optical assembly shown in FIG. 27.

FIG. 28 schematically illustrates an optical arrangement of an optical assembly 10K modified from those shown in FIG. 27. The optical assembly 10K has a point distinguishable from the optical assembly 10J shown in FIG. 27 that one of the red LDs 43B is omitted but two green LDs, 42A and 42B, and two blue LDs, 43A and 43B, are still implemented in the optical assembly 10K.

Some applications, mainly consumer applications such as the head-mount display, do not request an excellent coherency or monochromatism to the optical source. Rather, an excellent coherency inevitably accompanies with a lesser tolerance against noise light, which results in greater flickers of displayed images. Moreover, the flicker becomes conspicuous in green and/or blue light compared with red light. The arrangement of the present optical assembly 10K provides duplicate green LDs, 42A and 42B, and blue LDs, 43A and 43B, to soften the coherency (monochromatism) by combining the light emitted by duplicate LDs; but provides only one LD 41A for the red light. Moreover, commercially available green LD and blue LD generally show lesser output intensity. Accordingly, the modified optical assembly 10K provides a plural LDs, 42A and 42B, and 43A and 43B, for the green and blue light, but a single LD 41A for the red light to level the light.

[Second Modification]

The optical assemblies, 10J and 10K, shown in FIGS. 27 and 28 assume that two red LDs, 41A and 41B, emit red light, $L_{RA}$ and $L_{RB}$, with center wavelengths same to each other, two green LDs, 42A and 42B, each emit green lights, $L_{GA}$ and $L_{GB}$, with center wavelengths same to each other, and two blue LDs, 43A and 43B, each emits blue light, $L_{BA}$ and $L_{BB}$, with center wavelengths same to each other. In order to soften the coherency of the red, green, and blue light, two red LDs, 41A and 41B, preferably emit red light, $L_{RA}$ and $L_{RB}$, with wavelengths slightly different from others, two green LDs, 42A and 42B, emit green light, $L_{GA}$ and $L_{GB}$, with wavelengths slightly different from others; and two blue LDs, 43A and 43B, emit blue light, $L_{BA}$ and $L_{BB}$, with wavelengths slightly different from others. Specifically, the first red LD 41A emit light with the center wavelength of 640+α nm but the other red LD 41B emit the red light with the center wavelength of 640+β nm. Conditions above described are similarly applied to two green LDs, 42A and 42B, and to two blue LDs, 43A and 43B, where offset wavelengths, α and β, from the center wavelength is unnecessary to be even for the green and blue LDs, 42A to 43B. Such arrangements for the wavelengths of the LDs, 41A to 43B, may effectively soften the coherency.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An optical module that outputs multiplexed light containing red light, green light, and blue light, comprising:
    a first laser diode (LD) to emit a first light that is one of the red light, the green light or the blue light;
    a second LD to emit a second light that is one of the red light, the green light or the blue light excluding one used for the first LD;
    a third LD to emit third light that is one of the red light, the green light or the blue light excluding ones used for the first and second LDs;
    a first lens to collimate the first light emitted from the first LD to generate collimated first light;
    a second lens to collimate the second light emitted from the second LD to generate collimated second light;
    a third lens to collimate the third light emitted from the third LD to generate collimated third light;
    a package enclosing the first to third LDs and the first to third lenses;
    a first wavelength selective filter (WSF) that reflects one of the collimated first light and the collimated second light but transmits another of the collimated first and the collimated second light to generate mid-multiplexed light containing the collimated first light and the collimated second light whose optical axes are aligned to each other; and
    a second WSF that reflects one of the mid-multiplexed light and the collimated third light but transmits another of the mid-multiplexed light and the collimated third light,
    wherein the second WSF outputs the multiplexed light containing the collimated first light, the collimated second light, and the collimated third light whose optical axes are aligned to each other,
    wherein the collimated first light, the collimated second light, and the collimated third light are aligned with an optical axis of the optical module to be generated as the multiplexed light,
    wherein the first to third lenses and the first and second WSFs are mounted on a base, and
    wherein optical axes of the second and third LDs are substantially orthogonal to an optical axis of the first LD.

2. The optical module of claim 1, further comprising a mirror mounted on the base,
    wherein the mirror reflects the multiplexed light in a direction perpendicular to the base.

3. The optical module of claim 2,
    wherein each of the first light, the second light, and the third light has an ellipsoidal far-field pattern, and
    wherein the mirror provides a restricted area to reflect the multiplexed light, the multiplexed light reflected at the restricted area having a circular far-field pattern.

4. The optical module of claim 1,
    wherein the package is a CAN package.

5. The optical module of claim 4,
    wherein the CAN package includes a cap and a stem with a block protruding therefrom, the cap and the stem enclosing the first to third LDs, the first to third lenses, and the first and second WSFs therein air-tightly, the base being mounted in a side of the block, and
    wherein the multiplexed light is output in a direction perpendicular to the stem.

6. The optical module of claim 5,
    wherein the first to third LDs are mounted on the base.

7. The optical module of claim 5,
    wherein the first to third LDs are mounted on the side of the block.

8. The optical module of claim 5,
    wherein the block provides a pocket in the side thereof, the base being mounted within the pocket.

9. The optical module of claim 1,
wherein the first to third lenses and the first and second WSFs are mounted on the base via respective sub-bases.

10. The optical module of claim 1, wherein the second and third LDs are disposed on a same side with respect to the optical axis of the first LD.

11. The optical module of claim 1, wherein the second LD is disposed on a side opposite to the third LD with respect to the optical axis of the first LD.

12. The optical module of claim 1, wherein each focal length of first to third lenses is substantially shorter than 0.5 mm.

13. The optical module of claim 1, wherein the optical axes of the collimated first, second, and third lights contained in multiplexed light coincide with each other at a position distanced from the base by one meter in the optical axis of the optical module.

14. The optical module of claim 1, wherein the first light is the red light, the second light is the green light, and the third light is the blue light.

* * * * *